(12) United States Patent
Ye et al.

(10) Patent No.: US 10,932,185 B2
(45) Date of Patent: Feb. 23, 2021

(54) TRANSMITTER AND RECEIVER FOR MASTER INFORMATION BLOCK OVER PHYSICAL BROADCAST CHANNEL

(71) Applicant: Apple Inc., Cupertino, CA (US)

(72) Inventors: Qiaoyang Ye, Fremont, CA (US); Hwan-Joon Kwon, Santa Clara, CA (US); Abhijeet Bhorkar, Fremont, CA (US); Jeongho Jeon, San Jose, CA (US); Fatemeh Hamidi-Sepehr, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 16/060,401

(22) PCT Filed: Dec. 7, 2016

(86) PCT No.: PCT/US2016/065463
§ 371 (c)(1),
(2) Date: Jun. 7, 2018

(87) PCT Pub. No.: WO2017/127172
PCT Pub. Date: Jul. 27, 2017

(65) Prior Publication Data
US 2019/0007896 A1     Jan. 3, 2019

Related U.S. Application Data

(60) Provisional application No. 62/280,575, filed on Jan. 19, 2016, provisional application No. 62/287,306, filed on Jan. 26, 2016.

(51) Int. Cl.
*H04W 48/16* (2009.01)
*H04L 27/00* (2006.01)
(Continued)

(52) U.S. Cl.
CPC .......... *H04W 48/16* (2013.01); *H03M 13/09* (2013.01); *H04L 1/0061* (2013.01);
(Continued)

(58) Field of Classification Search
None
See application file for complete search history.

(56) References Cited

U.S. PATENT DOCUMENTS

2013/0028199 A1* 1/2013 Song .................... H04L 5/0073
370/329
2014/0050206 A1* 2/2014 Seo ..................... H04J 11/0069
370/336
(Continued)

OTHER PUBLICATIONS

International Preliminary Report on Patentability for International Patent Application No. PCT/US16/65463, dated Aug. 2, 2018.
(Continued)

*Primary Examiner* — Shripal K Khajuria
(74) *Attorney, Agent, or Firm* — Sterne, Kessler, Goldstein & Fox P.L.L.C.

(57) ABSTRACT

Described is an apparatus of an Evolved Node-B (eNB) operable to communicate with a User Equipment (UE) on a wireless network. The apparatus may comprise a circuitry operable to generate a Master Information Block (MIB) for transmission on one or more Physical Resource Blocks (PRBs). The apparatus may also comprise a circuitry operable to map the MIB onto at least one Orthogonal Frequency Division Multiplexing (OFDM) symbol of the PRBs outside of symbols 7, 8, 9, and 10. Transmission of the PRBs may be subject to an LBT procedure.

24 Claims, 14 Drawing Sheets

(51) Int. Cl.
*H04W 16/14* (2009.01)
*H03M 13/09* (2006.01)
*H04L 1/00* (2006.01)
*H04L 5/00* (2006.01)
*H04J 11/00* (2006.01)

(52) U.S. Cl.
CPC .......... *H04L 1/0068* (2013.01); *H04L 5/0048* (2013.01); *H04L 5/0053* (2013.01); *H04L 27/0006* (2013.01); *H04W 16/14* (2013.01); *H04J 11/00* (2013.01)

(56) References Cited

U.S. PATENT DOCUMENTS

| | | | | |
|---|---|---|---|---|
| 2015/0043420 A1* | 2/2015 | Xiong | ............ | H04W 56/00 370/315 |
| 2015/0195849 A1* | 7/2015 | Bashar | ............ | H04L 5/0092 370/330 |
| 2015/0264588 A1* | 9/2015 | Li | ............ | H04W 56/002 370/350 |
| 2016/0157229 A1* | 6/2016 | Zhuang | ............ | H04W 72/042 370/329 |
| 2016/0227583 A1* | 8/2016 | Chavva | ............ | H04L 5/14 |
| 2017/0041894 A1* | 2/2017 | Lee | ............ | H04W 72/04 |
| 2018/0159671 A1* | 6/2018 | Kim | ............ | H04J 11/0069 |
| 2018/0331774 A1* | 11/2018 | Ye | ............ | H04J 11/0069 |
| 2019/0007896 A1* | 1/2019 | Ye | ............ | H04L 5/0053 |
| 2019/0082412 A1* | 3/2019 | Zander | ............ | H04W 74/0833 |

OTHER PUBLICATIONS

International Search Report and Written Opinion for International Patent Application No. PCT/US2016/065463, dated Mar. 20, 2017.
Babaei, Alireza et al., "On the impact of LTE-U on Wi-Fi performance", IEEE 25th Annual International Symposium on Personal, Indoor, and Mobile Radio Communication (PIMRC), pp. 1621-1625, Sep. 2, 2014.
CMCC, "Discussion on possible solutions for LAA", 3GPP Draft; R1-144940, 3rd Generation Partnership Project (3GPP), Retrieved from the Internet via www.3gpp.org/ftp/Meetings_3GPP_SYNC/RAN1/Docs on Nov. 17, 2014, San Francisco, USA.
Kyocera, "Further considerations on the essential functionalities for LAA", 3GPP Draft; R1-144955, 3rd Generation Partnership Project (3GPP), retrieved from the Internet via www.3gpp.org/ftp/tsg_ran/WG1_RL1/TSGR1_79/Docs on Nov. 8, 2014.

* cited by examiner

TRANSMITTER AND RECEIVER FOR MASTER INFORMATION BLOCK OVER PHYSICAL BROADCAST CHANNEL

CLAIM OF PRIORITY

The present application is a National Stage Entry of, and claims priority to PCT Application No. PCT/US16/65463, filed on Dec. 7, 2016, entitled "Transmitter and Receiver for Master Information Block Over Physical Broadcast Channel," which claims priority under 35 U.S.C. § 119(e) to U.S. Provisional Patent Application Ser. No. 62/280,575 filed Jan. 19, 2016, entitled "MIB Over PBCH in Multefire Systems" and to U.S. Provisional Patent Application Ser. No. 62/287,306 filed Jan. 26, 2016, entitled "MIB Over PBCH in Multefire Systems," all of which are herein incorporated by reference in their entireties.

BACKGROUND

A variety of wireless cellular communication systems have been implemented over time, including a 3rd Generation Partnership Project (3GPP) Universal Mobile Telecommunications System, a 3GPP Long-Term Evolution (LTE) system, and a 3GPP LTE-Advanced (LTE-A) system. Next-generation wireless cellular communication systems based upon LTE and LTE-A systems are being developed, such as a fifth generation (5G) wireless system/5G mobile networks system.

Meanwhile, although there is a demand for increasingly high data rates in wireless cellular communication systems, license regimes limit the extent of usable spectrum for such systems.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
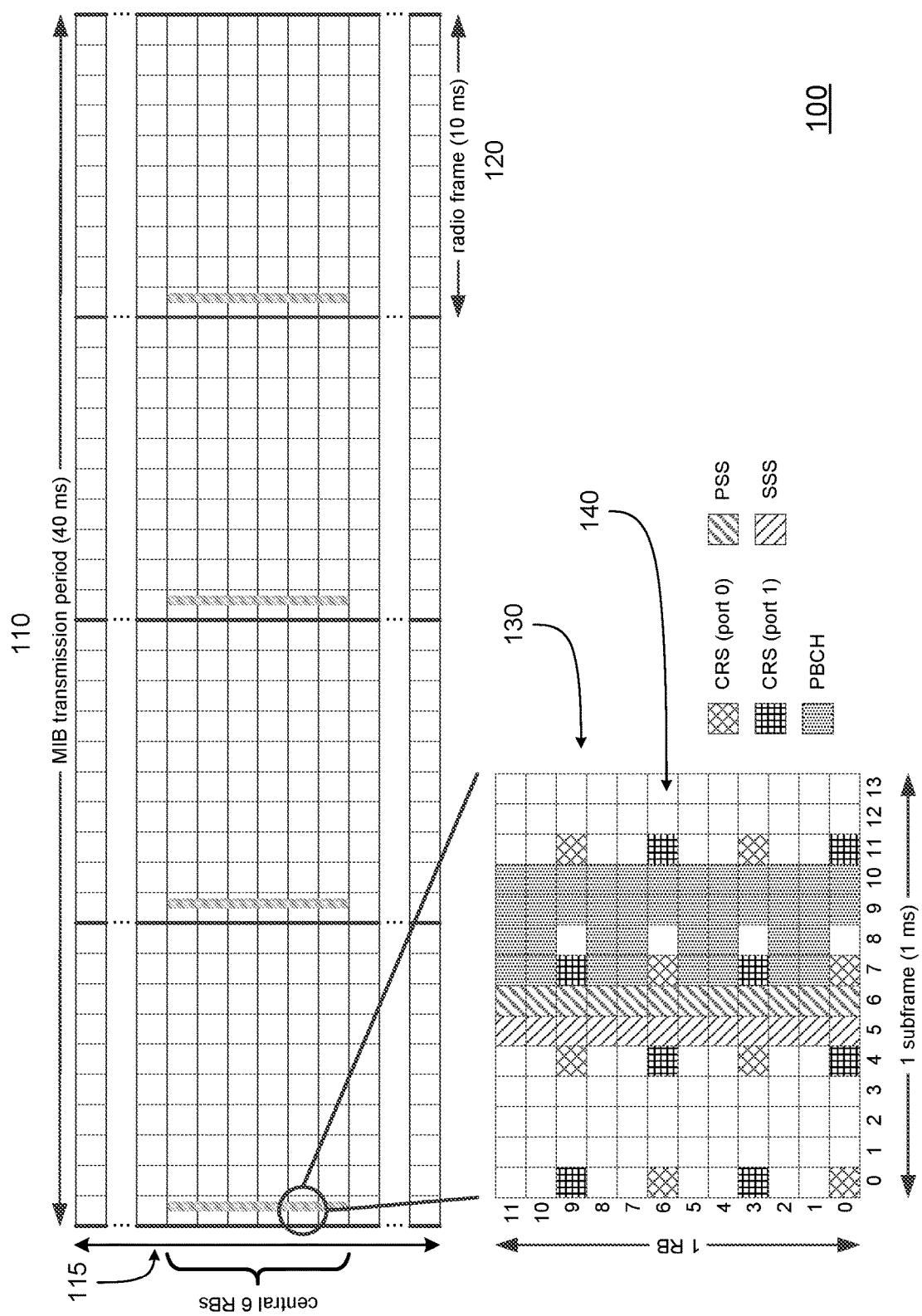
FIG. 1 illustrates a Physical Broadcast Channel (PBCH) structure in a 3rd Generation Partnership Project (3GPP) Long-Term Evolution (LTE) system, in accordance with some embodiments of the disclosure.

Various wireless cellular communication systems have been implemented or are being proposed, including a 3rd Generation Partnership Project (3GPP) Universal Mobile Telecommunications System (UMTS), a 3GPP Long-Term Evolution (LTE) system, a 3GPP LTE-Advanced system, and a 5th Generation wireless system/5th Generation mobile networks (5G) system/5th Generation new radio (NR) system.

Successive generations of wireless cellular technology seek to use ever higher data rates. On one hand, as physical-layer designs and implementations progress, further improvements in spectral efficiency may be marginal. On the other hand, licensed spectrum in lower-frequency bands is scarce. Both of these factors hinder improvements in data rates.

The limits on licensed spectrum have fostered an emerging interest in the operation of LTE systems (and successor systems) in unlicensed spectrum. For example, License-Assisted Access (LAA) may facilitate operation of LTE systems compliant with 3GPP Release 13, which may expand system bandwidth by utilizing a flexible Carrier Aggregation (CA) framework introduced in LTE-Advanced systems.

Enhanced system operation in unlicensed spectrum is targeted for future 3GPP releases, which may include 5G systems. Under one approach, operation in unlicensed spectrum may include LTE operation via Dual Connectivity (DC) based LAA. Under another approach, operation in unlicensed spectrum may include standalone LTE operation in unlicensed spectrum, in which LTE-based technology may operate in unlicensed spectrum alone and might not require an "anchor." Standalone LTE operation in unlicensed spectrum may include, for example, MulteFire™ technology by MulteFire Alliance of Fremont Calif., USA.

Whereas a CA-based LAA system may have an ideal backhaul between a Primary Cell (PCell) and a Secondary Cell (SCell), and may transmit system information over licensed spectrum, a DC based LAA systems may have a non-ideal backhaul between various Evolved Node-Bs (eNBs), such as between a Master (MeNB) and a Secondary eNB (SeNB). As a result, MeNB and SeNBs might not be synchronized, and a User Equipment (UE) might not be disposed to rely on System Information (SI) of an MeNB in a licensed carrier to determine SI in an unlicensed carrier. In other words, a UE may be disposed to acquiring key SI such as Master Information Block (MIB) from an SCell that may be activated with configured Physical Uplink Control Channel (PUCCH) among SeNBs. In some embodiments of DC based LAA systems, such an SCell may be termed a Primary SCell (PSCell). In some embodiments, a UE may be disposed to acquiring some System Information Blocks (SIBs) from an SeNB in scenarios in which the corresponding SI is not provided by Radio Resource Control (RRC) signaling from an MeNB.

Meanwhile, standalone systems lacking an "anchor" operating in licensed spectrum (which may include MulteFire™ systems) may be disposed to transmitting SI, including MIBs and SIBs, in unlicensed spectrum.

An unlicensed frequency band of interest in the operation of LTE systems and successor systems is the 5 Gigahertz (GHz) band, which has both a wide spectrum and common availability globally. The 5 GHz band is governed in the US by Unlicensed National Information Infrastructure (U-NII) rules from the Federal Communications Commission (FCC), and in Europe by the European Telecommunications Standards Institute (ETSI).

Collectively, Wireless Local Area Networks (WLANs), such as WLANs based on the IEEE 802.11 a/n/ac technologies, represent a significant incumbent technology in the 5 GHz band. Since WLAN systems may be widely deployed by both individuals and operators for carrier-grade access service and data offloading, sufficient care must be taken before deployment of potentially-conflicting LTE systems in the 5 GHz band.

In Listen-Before-Talk (LBT) procedures, a radio transmitter may first sense a medium and may then transmit through the medium if the medium is sensed to be idle. Release-13 LTE systems employing LAA may be disposed to incorporate LBT features to promote fair coexistence with incumbent WLAN systems.

Meanwhile, MIBs and SIBs may include system information that UEs may be disposed to acquire in order to be able to access and operate properly within a wireless network, or within a specific cell of a wireless network. In legacy LTE systems, a MIB may consist of 3 bits of bandwidth information, 3 bits of Physical Hybrid Automatic Repeat Request (HARQ) Indicator Channel (PHICH) configuration information, 8 bits of System Frame Number (SFN) information, 10 reserved bits, and 16 bits of Cyclic Redundancy Check (CRC) information.

These 40 bits may be encoded with a one-third-rate Tail-Bit Convolutional Code (TBCC). The resulting encoded 120 bits may then be repeated 16 times for a total output of 1920 bits, which may be scrambled with a scrambling sequence with a length of 1920 bits. These 1920 bits may be divided into four parts, and each part may be transmitted in subframe 0 of various radio frames within 40 milliseconds (ms). Within a duration of 40 ms, the same MIB may be repeatedly broadcast—for example, via a Physical Broadcast Channel (PBCH)—every 10 ms, and a new MIB may be generated every 40 ms.

FIG. 1 illustrates a PBCH structure in a 3GPP LTE system, in accordance with some embodiments of the disclosure. A PBCH structure 100 may comprise a MIB transmission period 110 in which a plurality of Resource Blocks (RBs) 130 (which may be Physical Resource Blocks (PRBs)) are transmitted across a system bandwidth 115 in a series of radio frames 120. As depicted in FIG. 1, MIB transmission period 110 may comprise 4 radio frames 120, and each radio frame 120 may in turn comprise 10 subframes encompassing 10 RBs 130. MIB transmission period 110 may span 40 milliseconds (ms), radio frames 120 may span 10 ms, and the subframes encompassing RBs 130 may span 1 ms.

Within MIB transmission period 110, a MIB may be repeatedly broadcast via PBCH in the first subframe of each radio frame 120. In some embodiments, the MIB may be broadcast via PBCH in the central 6 RBs 130 of the system bandwidth. Within MIB transmission period 110, the MIBs being broadcast may be identical. After one MIB transmission period 110 ends, another may begin, in which a new and potentially different MIB may be broadcast. In other words, a new MIB may be generated every 40 ms, and the same MIB may be broadcast repeatedly every 10 ms within the 40 ms period.

RBs 130 may comprise pluralities of Resource Elements (REs) 140 spanning a set of Orthogonal Frequency Division Multiplexed (OFDM) symbols in the time domain and spanning a set of subcarriers in the frequency domain. For example, an RB 130 may comprise REs 140 spanning 14 OFDM symbols (which may be enumerated from 0-13) and spanning 12 subcarriers (which may be enumerated from 0-11).

For OFDM symbols 0, 4, 7, and 11 at subcarriers 0, 3, 6, and 9, some REs 140 may carry port 0 Cell-specific Reference Signals (CRS) and some REs 140 may carry port 1 CRS. REs 140 in OFDM symbol 5 may carry Secondary Synchronization Signal (SSS), while REs 140 in OFDM symbol 6 may carry Primary Synchronization Signal (PSS). Various REs 140 in OFDM symbols 7 through 10 may carry PBCH. MIB may in turn be broadcast via REs carrying Physical Broadcast Channel (PBCH).

For example, as depicted in FIG. 1, PBCH carrying MIB may be transmitted in the first RB 130 in a radio frame 120. In some embodiments, PBCH carrying MIB may be transmitted in various REs 140 of the first 4 OFDM symbols of the second slot of the first subframe in the radio frame (e.g., the second half of the first RB 130 in a radio frame 120).

For some standalone systems (which may include MulteFire™ systems), some system information included in legacy LTE MIB may be less useful. As an example, some MulteFire™ systems may operate merely with a system bandwidth of 10 megahertz (MHz) or 20 MHz, and as a result, 3 bits in a MIB may not be needed for bandwidth indication. With respect to PHICH configuration information, for Release 13 LAA, a UE may not be disposed to receive PHICH. For MulteFire™ systems, a PHICH configuration may be fixed to a smallest value, which may advantageously reduce overhead. A UE may not be disposed to receive PHICH in MulteFire™ systems since an asynchronous HARQ process may be used for UL transmission in MulteFire. As a result, 3 bits in a MIB may not be needed for PHICH configuration indication.

On the other hand, for such standalone systems, other system information not included in legacy LTE MIB may be useful. For example, for MulteFire™ systems, MIB may be inserted in Discovery Reference Signal (DRS). In Release 13 LAA (which may provide a baseline for MulteFire™ design), a location for DRS transmission within a DRS Measurement Timing Configuration (DMTC) window may be floating, which may advantageously increase transmission opportunities for DRS. In some embodiments, for example, DRS may be transmitted in any subframe.

SSS and/or CRS sequences within DRS may not be unique for each subframe. For example, SSS and/or CRS sequences transmitted in subframes 0 through 4 in Release 13 LAA may use a sequence generated for subframe 0 in Release 12 LTE, and SSS and/or CRS sequences transmitted in subframes 5 through 9 in Release 13 LAA may use a sequence generated for subframe 5 in Release 12 LTE. Accordingly, a UE may perceive the first half and/or second half of a radio frame but might not perceive the subframe index, relying on SSS and/or CRS detection Accordingly, inclusion of subframe index information in MIB may be advantageous.

Moreover, since MIB transmission in unlicensed spectrum may be subject to LBT, MIB might not be transmitted frequently. It may be desirable to improve MIB detection performance based on a single PBCH transmission in order to shorten SI acquisition time. One method to improve the performance may be to increase MIB repetitions per transmission, which may lead to either reduced payload, or increased number of symbols per transmission carrying MIB.

Discussed herein are mechanisms for transmitting MIB in standalone systems (which may include MulteFire™ systems). The MIB may advantageously include subframe index information, have varying numbers of payload bits, and/or be transmitted on OFDM symbols other than symbols 7, 8, 9, and 10.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, for purposes of the present disclosure, the term "eNB" may refer to a legacy eNB, a next-generation or 5G eNB, an mmWave eNB, an mmWave small cell, an AP, and/or another base station for a wireless communication system. For purposes of the present disclosure, the term "UE" may refer to a UE, a 5G UE, an mmWave UE, an STA, and/or another mobile equipment for a wireless communication system.

Various embodiments of eNBs and/or UEs discussed below may process one or more transmissions of various types. Some processing of a transmission may comprise demodulating, decoding, detecting, parsing, and/or otherwise handling a transmission that has been received. In some embodiments, an eNB or UE processing a transmission may determine or recognize the transmission's type and/or a condition associated with the transmission. For some embodiments, an eNB or UE processing a transmission may act in accordance with the transmission's type, and/or may act conditionally based upon the transmission's type. An eNB or UE processing a transmission may also recognize one or more values or fields of data carried by the transmission. Processing a transmission may comprise moving the transmission through one or more layers of a protocol stack (which may be implemented in, e.g., hardware and/or software-configured elements), such as by moving a transmission that has been received by an eNB or a UE through one or more layers of a protocol stack.

Various embodiments of eNBs and/or UEs discussed below may also generate one or more transmissions of various types. Some generating of a transmission may comprise modulating, encoding, formatting, assembling, and/or otherwise handling a transmission that is to be transmitted. In some embodiments, an eNB or UE generating a transmission may establish the transmission's type and/or a condition associated with the transmission. For some embodiments, an eNB or UE generating a transmission may act in accordance with the transmission's type, and/or may act conditionally based upon the transmission's type. An eNB or UE generating a transmission may also determine one or more values or fields of data carried by the transmission. Generating a transmission may comprise moving the transmission through one or more layers of a protocol stack (which may be implemented in, e.g., hardware and/or software-configured elements), such as by moving a transmission to be sent by an eNB or a UE through one or more layers of a protocol stack.

In various embodiments discussed herein, a MIB payload may comprise varying numbers of bits. In some embodiments, the MIB payload may comprise other than a number of bits corresponding with a legacy LTE MIB payload size (e.g., other than 40 bits). In other embodiments, the MIB payload may comprise 40 bits. For various embodiments, the bits of the MIB payload may carry one or more indicators and/or fields other than indicators and/or fields of a legacy LTE MIB. In addition, in various embodiments, MIB (as carried by PBCH, for example) may be mapped to various OFDM symbols other than OFDM symbols onto which MIB may be mapped in legacy LTE implementations (e.g., other than OFDM symbols 7, 8, 9, and 10).

In some embodiments, a MIB payload may comprise at least 1 bit of bandwidth indication, 3 bits of subframe index information, 8 bits of System Frame Number (SFN) information, and/or 16 bits of CRC information. With respect to bandwidth indication, a 1-bit bandwidth indication may be sufficient to support a selection between 10 MHz and 20 MHz system bandwidth.

With respect to subframe index information, as discussed above, a location of DRS may be floating within a DMTC window or DRS transmission window (DTxW). Moreover, one SSS and/or CRS generation may use one sequence for subframes 0 through 4 and another sequence for subframes 5 through 9. The half of a radio frame to which a subframe belongs may accordingly be detected based upon an SSS and/or CRS sequence. A 3-bit subframe index may be sufficient to indicate an offset from the start of a half-frame, e.g., an offset of 0, 1, 2, 3, or 4 subframes from either subframe 0 or subframe 5.

With respect to SFN information, a most significant 8 bits may be transmitted in MIB, and the other 2 bits may be indicated via selection of CRC and scrambling sequence, where four different scrambling sequences may correspond to four values corresponding to the 2 bits. In some embodiments 10 bits may be used for SFN information, and fewer bits may be reserved bits. With respect to CRC information, 16 bits may be transmitted in the MIB payload.

A MIB payload may accordingly comprise at least 28 bits corresponding to bandwidth indication, subframe index information, SFN information, and CRC information. A MIB payload may also comprise additional number of bits X. In various embodiments, one or more of the X bits may be reserved for future use and/or used as additional bits for the various MIB payload indicators and fields described herein. For example, 2 of the X additional bits may be used for SFN information in addition to the 8 bits discussed herein. As another example, 1 of the X additional bits may be used for subframe index information in addition to the 3 bits discussed herein to indicate an offset from the start of a full radio frame, e.g., an offset of 0, 1, 2, 3, 4, 5, 6, 7, 9, or 9 subframes from subframe 0. In some embodiments, X may be 12, and the total number of bits in the MIB payload may be 40 bits (which may be similar to a number of bits in a legacy LTE MIB payload).

For some embodiments, X may be 4, and a total number of bits in the MIB payload may be 32 bits. In such embodiments, the MIB payload may accordingly comprise 4 additional bits which may be reserved for future use. In some such embodiments, one or more of these bits may be used as additional bits for various MIB payload indicators and fields. In some embodiments, X may be 2, and a total number of bits in the MIB payload may be 30 bits. In such embodiments, the MIB payload may accordingly comprise 2 additional bits, which may be reserved for future use. In some such embodiments, one or both of these bits may be used as additional bits for various MIB payload indicators and fields.

In various embodiments, MIB may be transmitted (via PBCH) over sets of OFDM symbols. In the transmission process, a MIB payload may be encoded, rate-matched, punctured, modulated, mapped, and transmitted over a wireless communication channel (e.g., by an eNB, or by an apparatus of an eNB). A MIB payload may be received from a wireless communication channel, de-mapped, de-modulated, zero-padded, de-rate-matched, and decoded (e.g., by a UE, or by an apparatus of a UE).

Figure 2:
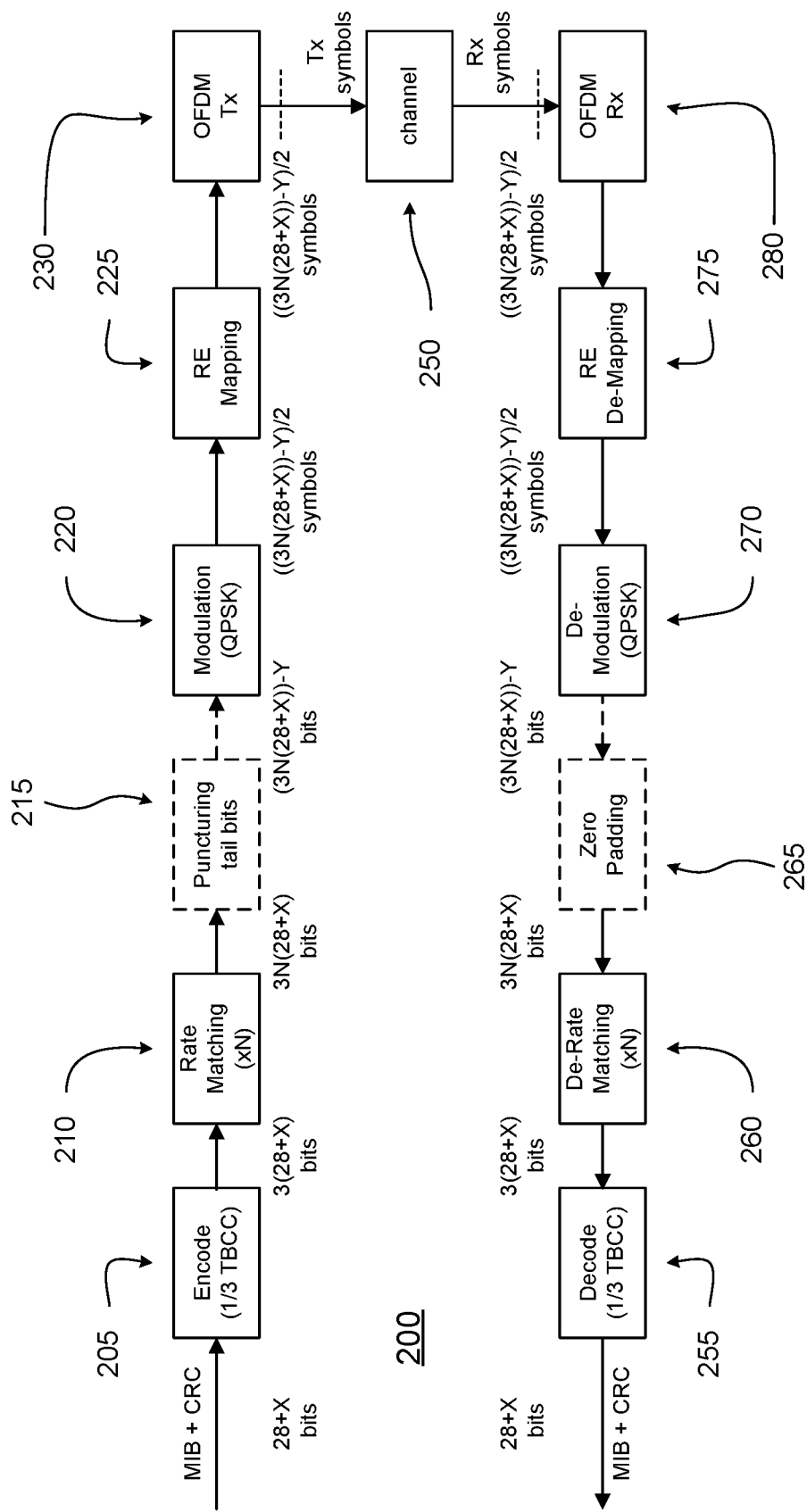
FIG. 2 illustrates a scenario of transmission of PBCH and Master Information Block (MIB) over four Orthogonal Frequency-Division Multiplexing (OFDM) symbols, in accordance with some embodiments of the disclosure.

FIG. 2 illustrates a scenario of transmission of PBCH and Master Information Block (MIB) over four Orthogonal Frequency-Division Multiplexing (OFDM) symbols, in accordance with some embodiments of the disclosure. A scenario 200 may comprise an encoding circuitry 205, a rate matching circuitry 210, a puncturing circuitry 215, a modulating circuitry 220, a mapping circuitry 225, and/or a transmitting circuitry 230, one or more of which may be implemented in an eNB, or in an apparatus of an eNB. Scenario 200 may also comprise a receiving circuitry 280, a de-mapping circuitry 275, a de-modulating circuitry 270, a zero-padding circuitry 265, a de-rate-matching circuitry 260, and/or a decoding circuitry 255, one or more of which may be implemented in a UE, or in an apparatus of a UE. In scenario 200, transmitting circuitry 230 and receiving circuitry 280 may communicate over a wireless communication channel 250.

In the transmission path, encoding circuitry 205 may have an input accepting a MIB payload (which may comprise 28+X bits), and an output comprising 3(28+X) bits, where X may be an integer. Encoding circuitry 205 may encode the 28+X bits with a one-third-rate TBCC (which results in the corresponding factor of 3 between the number of input bits and the number of output bits) to produce the 3(28+X) bits. In some embodiments, encoding circuitry 205 may encode the 28+X bits with a code having a rate other than a one-third rate. In such embodiments, the corresponding factor between the number of input bits and the number of output bits may be other than 3.

Rate matching circuitry 210 may have an input coupled to the output of encoding circuitry 205, and an output comprising 3N(28+X) bits, where N may be an integer. Rate matching circuitry 210 may repeat the 3(28+X) bits N times.

The bits may be scrambled, for example at the output of rate-matching circuitry 210. In some embodiments, the scrambling sequence may be the same across different PBCH transmissions. For example, there may be 4 different scrambling sequences, which may be used to scramble 4 PBCH transmissions within every 40 ms, respectively. In some embodiments, the scrambling sequence may be part of a 1920-bit scrambling sequence used for PBCH transmission in a legacy LTE implementation.

Puncturing circuitry 215 may have an input coupled to the output of rate matching circuitry 210, and an output comprising (3N(28+X))−Y, where Y may be an integer. Puncturing circuitry 215 may puncture Y tail bits of the bits provided at its input. In some embodiments, puncturing may be performed before scrambling in the transmission path.

Modulation circuitry 220 may have an input coupled to the output of puncturing circuitry 215, and an output comprising ((3N(28+X))−Y)/2 symbols. Modulating circuitry may modulate input bits onto output symbols. In some embodiments, QPSK modulation may be performed (which may result in the corresponding factor of ½ between the number of input bits and the number of output symbols). In some embodiments, another modulation may be performed. In such embodiments, the corresponding factor between the number of input bits and the number of output symbols may be other than ½.

Mapping circuitry 225 may have an input coupled to the output of modulation circuitry 220, and an output comprising ((3N(28+X))−Y)/2 symbols. Mapping circuitry 225 may map the symbols provided at its input to REs across various OFDM symbols.

Transmitting circuitry 230 may have an input coupled to the output of mapping circuitry 225, and an output coupled to wireless communication channel 250. Transmitting circuitry 230 may transmit the OFDM symbols at its input onto wireless communication channel 250.

In the receive path, receiving circuitry 280 may have an input coupled to the wireless communication channel 250, and an output comprising ((3N(28+X))−Y)/2 symbols. Receiving circuitry 280 may transmit OFDM symbols from wireless communication channel 250 to de-mapping circuitry 275.

De-mapping circuitry 275 may have an input coupled to the output of receiving circuitry 280, and an output comprising ((3N(28+X))−Y)/2 symbols. De-mapping circuitry 275 may de-map the symbols from REs across various OFDM symbols at its input.

De-modulation circuitry 270 may have an input coupled to the output of de-mapping circuitry 275, and an output comprising (3N(28+X))−Y bits. De-modulation circuitry 270 may de-modulate input symbols to output bits. In some embodiments, QPSK modulation may be performed (which may result in the corresponding factor of 2 between the number of input symbols and the number of output bits). In some embodiments, another de-modulation may be performed. In such embodiments, the corresponding factor between the number of input symbols and the number of output bits may be other than 2.

Zero-padding circuitry 265 may have an input coupled to the output of de-modulation circuitry, and an output comprising 3N(28+X) bits. Zero-padding circuitry 265 may pad bits provided at its input with a number Y of zeroes.

The bits may be de-scrambled, for example at the input to de-rate-matching circuitry 260. In some embodiments, zero-padding may be performed after de-scrambling in the transmission path.

De-rate-matching circuitry 260 may have an input coupled to the output of zero-padding circuitry 265, and an output comprising 3(28+X) bits. De-rate-matching circuitry 260 may accordingly combine the N repetitions of the 3(28+X) bits.

Decoding circuitry 255 may have an input coupled to the output of de-rate-matching circuitry 260, and an output carrying a MIB payload (which may comprise 28+X bits). Decoding circuitry 255 may decode the 3(28+X) bits with a one-third-rate TBCC (which results in the corresponding factor of ⅓ between the number of input bits and the number of output bits) to produce the 28+X bits. In some embodiments, decoding circuitry may decode the 3(28+X) bits with a code having a rate other than a one-third rate. In such embodiments, the corresponding factor between the number of input bits and the number of output bits may be other than ⅓.

In some embodiments, if (3N(28+X)) bits exceeds a number of bits that may be carried in MIB in a central 6 RBs of a system bandwidth, puncturing circuitry 215 may puncture, or remove, a number of bits Y from the tail-end of the 3N(28+X) bits provided at the input of puncturing circuitry 215. In such embodiments, zero-padding circuitry 265 may add zeroes to a tail-end of the (3N(28+X))−Y bits provided at the input of zero-padding circuitry 265. Otherwise, scenario 200 might not comprise puncturing circuitry 215 and/or zero-padding circuitry 265. In such embodiments, an input of modulation circuitry 220 may be coupled to an output of rate matching circuitry 210, and an input of de-rate-matching circuitry 260 may be coupled to an output of de-modulation circuitry 270.

The integer X may have a predetermined value to reflect a number of bits to be reserved, and/or a number of additional bits for use in extending information and/or fields within the MIB payload. Meanwhile, the MIB payload may be mapped onto a predetermined set of OFDM symbols (e.g., four or five or six of OFDM symbols 3, 4, 7, 8, 9, 10 and/or 11). The integers N and Y may have predetermined values that depend upon the size of the MIB payload (and in turn upon the predetermined value of X), and upon the predetermined set of OFDM symbols.

For example, with reference to FIG. 1, OFDM symbols 0, 1, 4, 7, 8, and/or 11 of RB 130 may carry MIB in 8 subcarriers across RB 130 in some embodiments (e.g., for embodiments in which those OFDM symbols carry CRS in 4 subcarriers across RB 130). Meanwhile, OFDM symbols 2, 3, 9, 10, 12, and/or 13 may carry MIB in 12 subcarriers across RB 130 in some embodiments (e.g., for embodiments in which those OFDM symbols do not carry CRS in any subcarriers across RB 130). In various embodiments, OFDM symbols not carrying CRS may carry MIB in 12 subcarriers across RB 130, and OFDM symbols carrying CRS may carry MIB in fewer than 12 subcarriers across RB 130. The number of symbols carrying MIB in the central 6 RBs 130 of a system bandwidth may then span the total number of symbols that may carry MIB within the predetermined set of OFDM symbols multiplied by 6.

In various embodiments, MIB with different payloads may be transmitted over different number of OFDM symbols. For example, for MIB payload sizes of 32 bits or 30 bits or 40 bits, MIB may be transmitted over OFDM symbols 4, 7, 8, 9, 10, and/or 11 (and some tail bits may be punctured to meet resource constraints). As an alternative example, for a MIB payload size of 40 bits, MIB may be transmitted over OFDM symbols 3, 7, 8, 9, and 10 (with no puncturing). In some embodiments, other symbols (such as symbols 2, 7, 8, 9, and 10) may also be used for MIB transmission. Moreover, in some embodiments, MIB contents may or may not be the same across PBCH transmissions.

Figure 3:
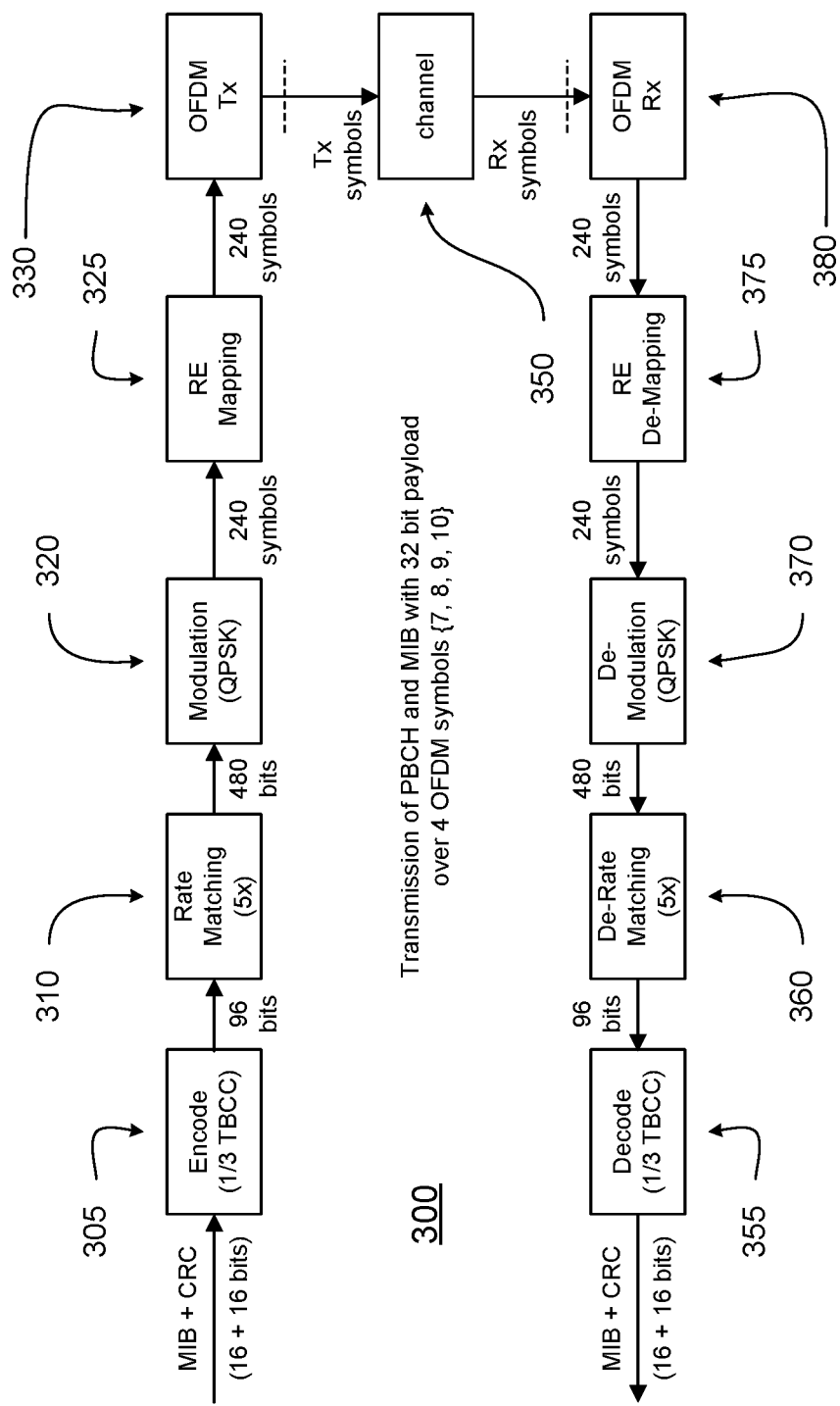
FIGS. 3-8 illustrate scenarios of transmission of PBCH and MIB over various numbers of OFDM symbols, in accordance with some embodiments of the disclosure.

The following figures present some illustrative examples. FIGS. 3-8 illustrate scenarios of transmission of PBCH and MIB over various numbers of OFDM symbols, in accordance with some embodiments of the disclosure. FIG. 3 illustrates a scenario 300 comprising an encoding circuitry 305, a rate matching circuitry 310, a modulating circuitry 320, a mapping circuitry 325, and/or a transmitting circuitry 330 (one or more of which may be implemented in an eNB, or in an apparatus of an eNB). Scenario 300 may also comprise a receiving circuitry 380, a de-mapping circuitry 375, a de-modulating circuitry 370, a de-rate-matching circuitry 360, and/or a decoding circuitry 355 (one or more of which may be implemented in a UE, or in an apparatus of a UE). The various circuitries of scenario 300 may be similar to the similarly-named circuitries of scenario 200. In scenario 300, transmitting circuitry 330 and receiving circuitry 380 may communicate over a wireless communication channel 350.

In scenario 300, MIB may be transmitted over OFDM symbols 7, 8, 9, and 10, and may have a 32 bit payload. As discussed above, OFDM symbols 7 and 8 may carry MIB in 8 subcarriers across an RB, and OFDM symbols 9 and 10 may carry MIB in 12 subcarriers across an RB. As a result, an RB may carry MIB in a total of 40 REs (and accordingly 40 symbols), and a central 6 RBs of a system bandwidth may then carry MIB in a total of 240 symbols.

The 240 symbols of MIB may correspond to a 480-bit input to modulation circuitry 320. Meanwhile, the 32-bit MIB payload may correspond to a 96-bit input to rate-matching circuitry 310. In turn, scenario 300 may employ an integer N for rate-matching circuitry 310 having a value of 5, and rate-matching circuitry 310 may repeat the MIB payload 5 times for a total of 480 bits. The number of symbols that may be carried in MIB in a central 6 RBs of a system bandwidth may accordingly correspond to the number of bits that may be output from rate-matching circuitry 310. As a result, no bits need to be punctured from the tail-end of the bits output from rate-matching circuitry 310, and as a result scenario 300 might not comprise a puncturing circuitry and/or a zero-padding circuitry.

Figure 4:
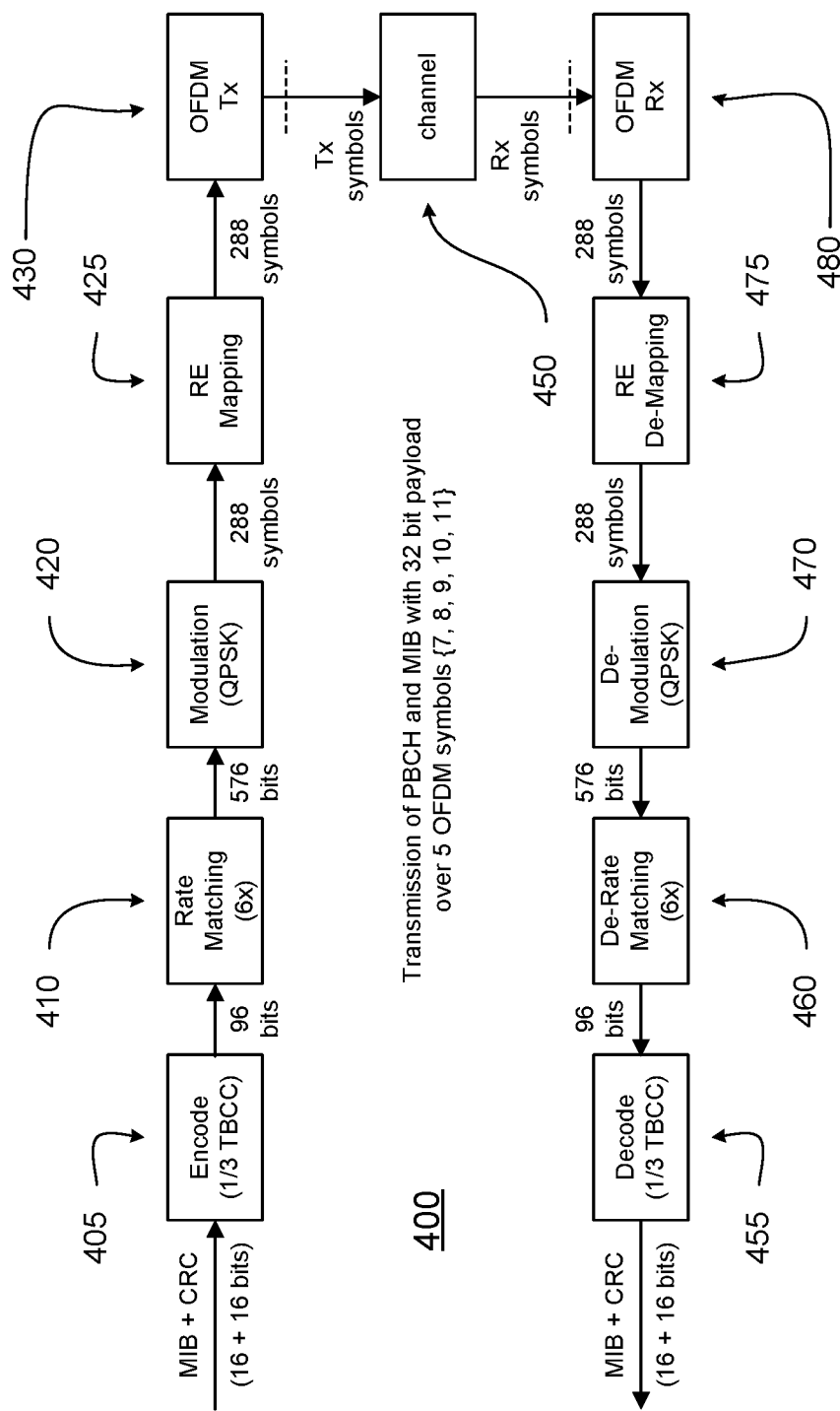

FIG. 4 illustrates a scenario 400 comprising an encoding circuitry 405, a rate matching circuitry 410, a modulating circuitry 420, a mapping circuitry 425, and/or a transmitting circuitry 430 (one or more of which may be implemented in an eNB, or in an apparatus of an eNB). Scenario 400 may also comprise a receiving circuitry 480, a de-mapping circuitry 475, a de-modulating circuitry 470, a de-rate-matching circuitry 460, and/or a decoding circuitry 455 (one or more of which may be implemented in a UE, or in an apparatus of a UE). The various circuitries of scenario 400 may be similar to the similarly-named circuitries of scenario 200. In scenario 400, transmitting circuitry 430 and receiving circuitry 480 may communicate over a wireless communication channel 450.

In scenario 400, MIB may be transmitted over OFDM symbols 7, 8, 9, 10, and 11, and may have a 32 bit payload. As discussed above, OFDM symbols 7, 8, and 11 may carry MIB in 8 subcarriers across an RB, and OFDM symbols 9 and 10 may carry MIB in 12 subcarriers across an RB. As a result, an RB may carry MIB in a total of 48 REs (and accordingly 48 symbols), and a central 6 RBs of a system bandwidth may then carry MIB in a total of 288 symbols.

The 288 symbols of MIB may correspond to a 576-bit input to modulation circuitry 420. Meanwhile, the 32-bit MIB payload may correspond to a 96-bit input to rate-matching circuitry 410. In turn, scenario 400 may employ an integer N for rate-matching circuitry 410 having a value of 6, and rate-matching circuitry 410 may repeat the MIB payload 6 times for a total of 576 bits. The number of symbols that may be carried in MIB in a central 6 RBs of a system bandwidth may accordingly correspond to the number of bits that may be output from rate-matching circuitry 410. As a result, no bits need to be punctured from the tail-end of the bits output from rate-matching circuitry 410, and as a result scenario 400 might not comprise a puncturing circuitry and/or a zero-padding circuitry.

Figure 5:
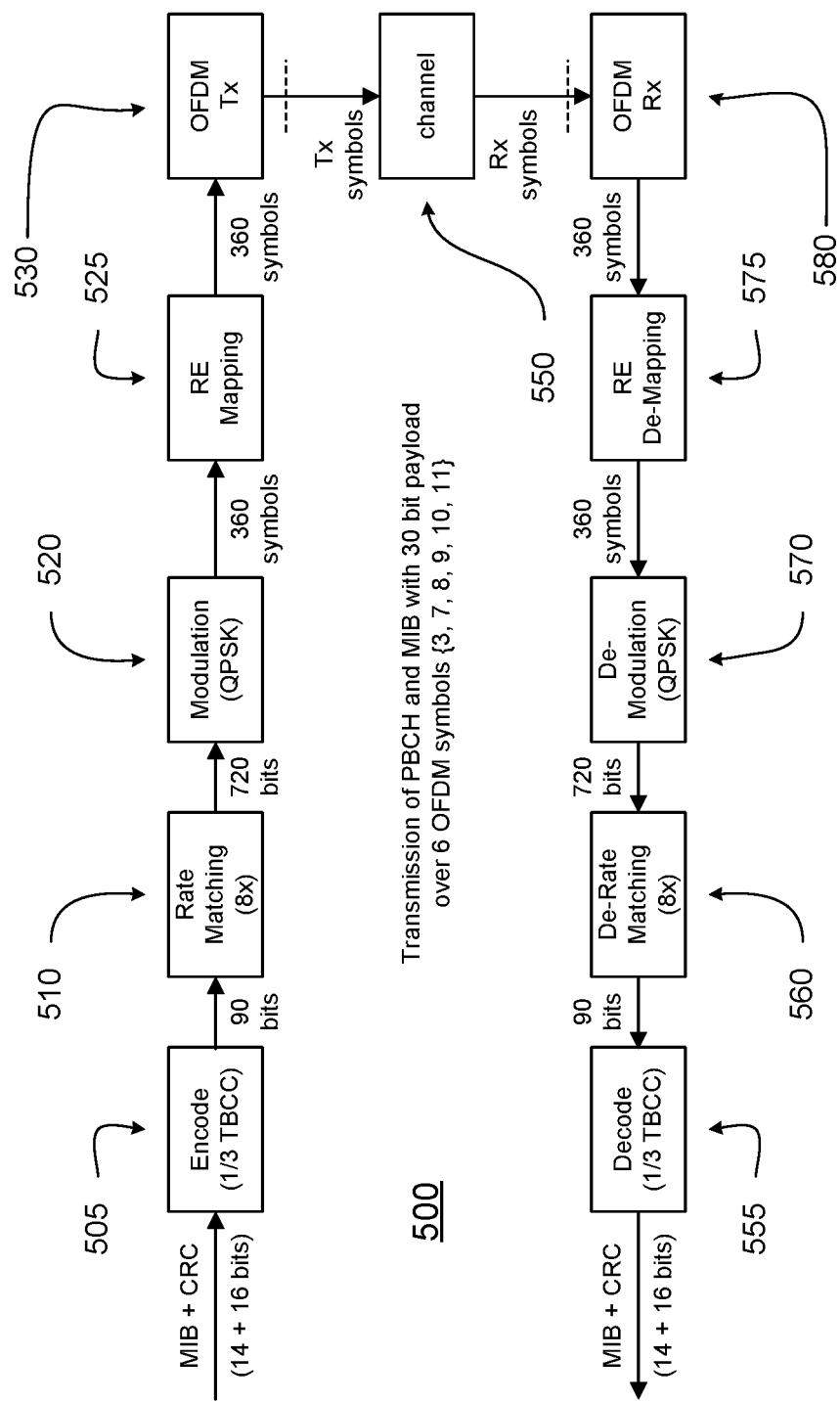

FIG. 5 illustrates a scenario 500 comprising an encoding circuitry 505, a rate matching circuitry 510, a modulating circuitry 520, a mapping circuitry 525, and/or a transmitting circuitry 530 (one or more of which may be implemented in an eNB, or in an apparatus of an eNB). Scenario 500 may also comprise a receiving circuitry 580, a de-mapping circuitry 575, a de-modulating circuitry 570, a de-rate-matching circuitry 560, and/or a decoding circuitry 555 (one or more of which may be implemented in a UE, or in an apparatus of a UE). The various circuitries of scenario 500 may be similar to the similarly-named circuitries of scenario 200. In scenario 500, transmitting circuitry 530 and receiving circuitry 580 may communicate over a wireless communication channel 550.

In scenario 500, MIB may be transmitted over OFDM symbols 3, 7, 8, 9, 10, and 11, and may have a 30 bit payload. As discussed above, OFDM symbols 7, 8, and 11 may carry MIB in 8 subcarriers across an RB, and OFDM symbols 3, 9, and 10 may carry MIB in 12 subcarriers across an RB. As a result, an RB may carry MIB in a total of 60 REs (and accordingly 60 symbols), and a central 6 RBs of a system bandwidth may then carry MIB in a total of 360 symbols.

The 360 symbols of MIB may correspond to a 720-bit input to modulation circuitry 520. Meanwhile, the 30-bit MIB payload may correspond to a 90-bit input to rate-matching circuitry 510. In turn, scenario 500 may employ an integer N for rate-matching circuitry 510 having a value of 8, and rate-matching circuitry 510 may repeat the MIB payload 8 times for a total of 720 bits. The number of symbols that may be carried in MIB in a central 6 RBs of a system bandwidth may accordingly correspond to the number of bits that may be output from rate-matching circuitry 510. As a result, no bits need to be punctured from the tail-end of the bits output from rate-matching circuitry 510, and as a result scenario 500 might not comprise a puncturing circuitry and/or a zero-padding circuitry.

Figure 6:
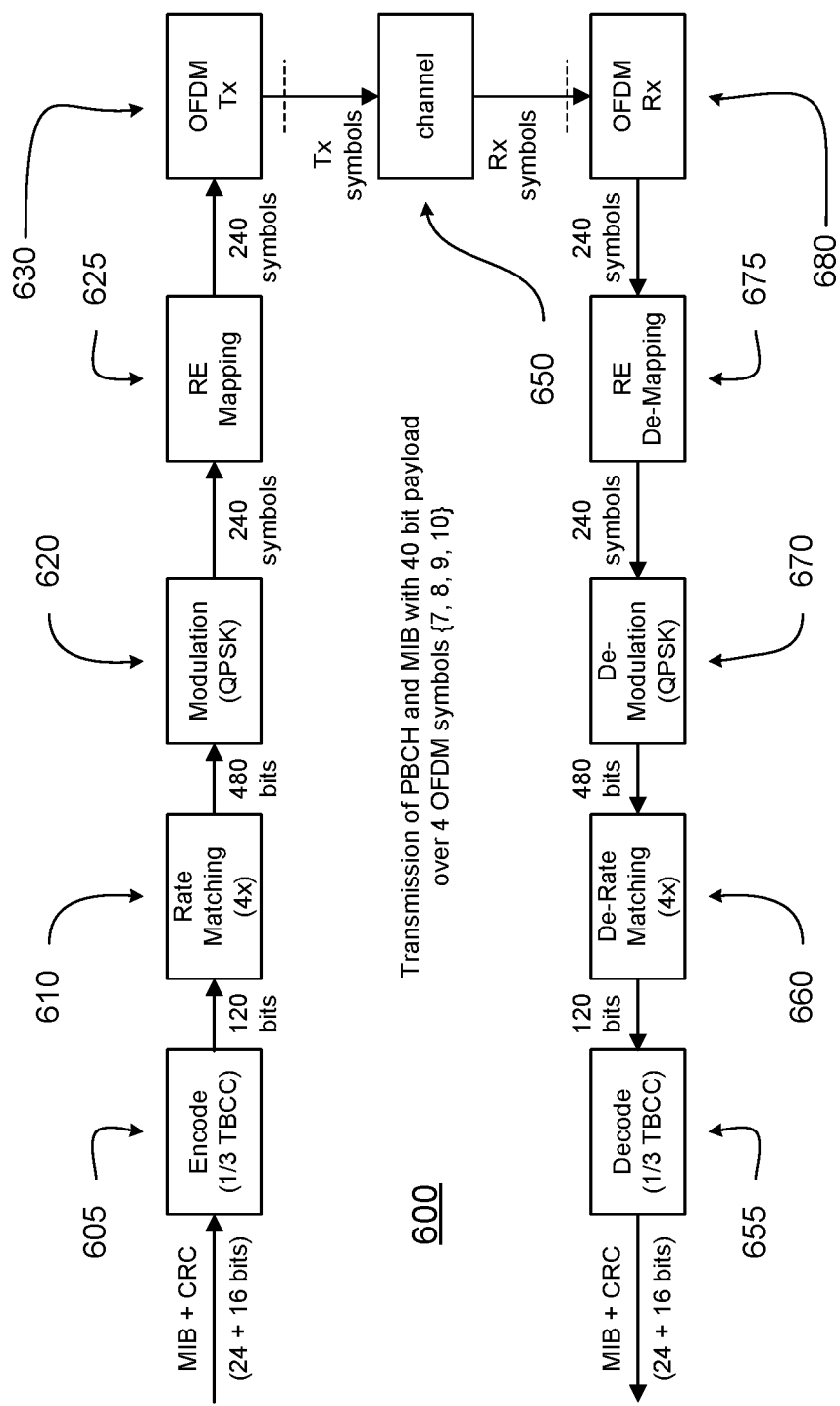

FIG. 6 illustrates a scenario 600 comprising an encoding circuitry 605, a rate matching circuitry 610, a modulating circuitry 620, a mapping circuitry 625, and/or a transmitting circuitry 630 (one or more of which may be implemented in an eNB, or in an apparatus of an eNB). Scenario 600 may also comprise a receiving circuitry 680, a de-mapping circuitry 675, a de-modulating circuitry 670, a de-rate-matching circuitry 660, and/or a decoding circuitry 655 (one or more of which may be implemented in a UE, or in an apparatus of a UE). The various circuitries of scenario 600 may be similar to the similarly-named circuitries of scenario 200. In scenario 600, transmitting circuitry 630 and receiving circuitry 680 may communicate over a wireless communication channel 650.

In scenario 600, MIB may be transmitted over OFDM symbols 7, 8, 9, and 10, and may have a 40 bit payload. As discussed above, OFDM symbols 7 and 8 may carry MIB in 8 subcarriers across an RB, and OFDM symbols 9 and 10 may carry MIB in 12 subcarriers across an RB. As a result, an RB may carry MIB in a total of 40 REs (and accordingly 40 symbols), and a central 6 RBs of a system bandwidth may then carry MIB in a total of 240 symbols.

The 240 symbols of MIB may correspond to a 480-bit input to modulation circuitry 620. Meanwhile, the 40-bit MIB payload may correspond to a 120-bit input to rate-matching circuitry 610. In turn, scenario 600 may employ an integer N for rate-matching circuitry 610 having a value of 4, and rate-matching circuitry 610 may repeat the MIB payload 4 times for a total of 480 bits. The number of symbols that may be carried in MIB in a central 6 RBs of a system bandwidth may accordingly correspond to the number of bits that may be output from rate-matching circuitry 610. As a result, no bits need to be punctured from the tail-end of the bits output from rate-matching circuitry 610, and as a result scenario 600 might not comprise a puncturing circuitry and/or a zero-padding circuitry.

Figure 7:
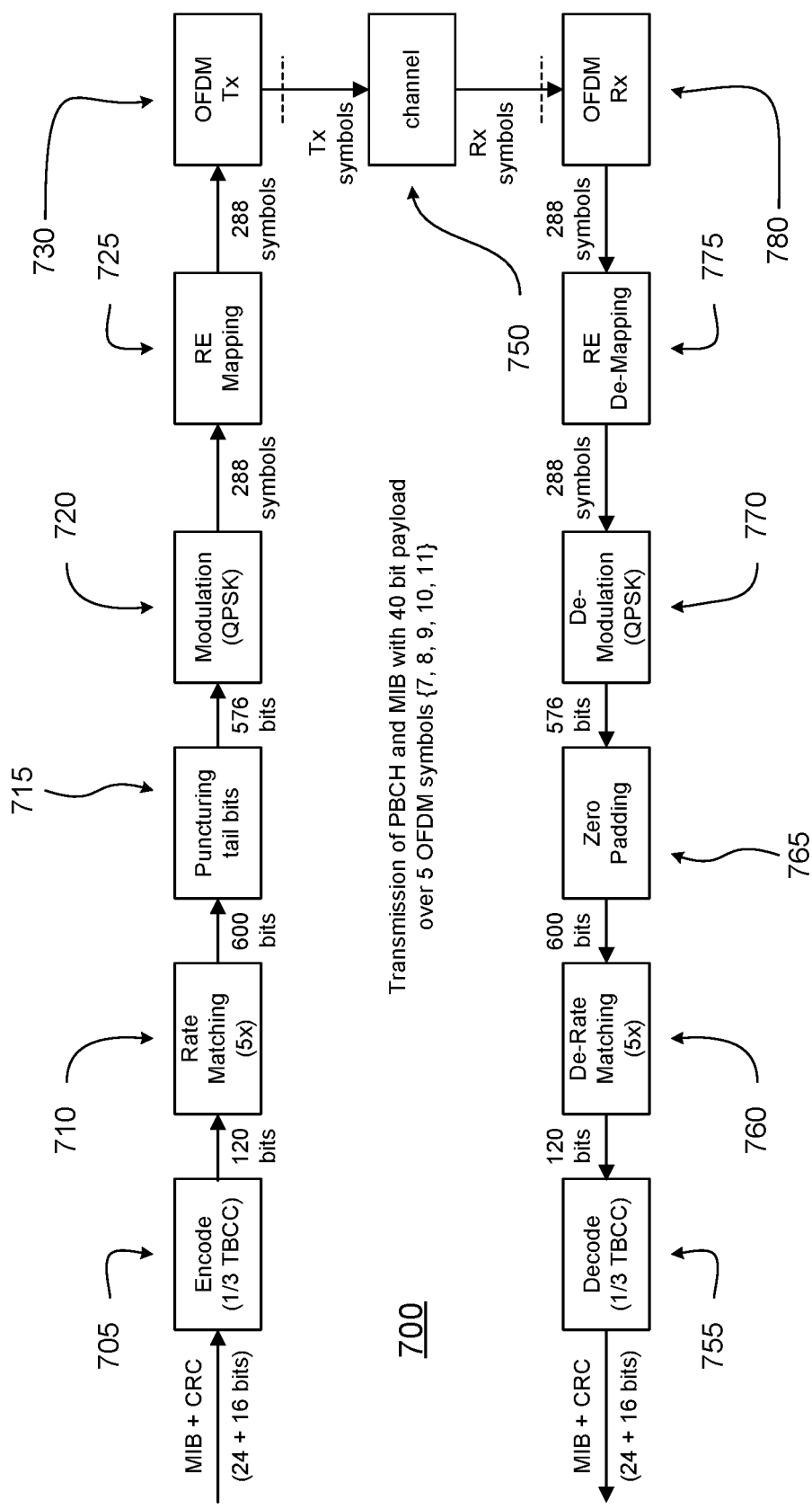

FIG. 7 illustrates a scenario 700 comprising an encoding circuitry 705, a rate matching circuitry 710, a puncturing circuitry 715, a modulating circuitry 720, a mapping circuitry 725, and/or a transmitting circuitry 730 (one or more of which may be implemented in an eNB, or in an apparatus of an eNB). Scenario 700 may also comprise a receiving circuitry 780, a de-mapping circuitry 775, a de-modulating circuitry 770, a zero-padding circuitry 765, a de-rate-matching circuitry 760, and/or a decoding circuitry 755 (one or more of which may be implemented in a UE, or in an apparatus of a UE). The various circuitries of scenario 700 may be similar to the similarly-named circuitries of scenario 200. In scenario 700, transmitting circuitry 730 and receiving circuitry 780 may communicate over a wireless communication channel 750.

In scenario 700, MIB may be transmitted over OFDM symbols 7, 8, 9, 10, and 11, and may have a 40 bit payload. As discussed above, OFDM symbols 7, 8, and 11 may carry MIB in 8 subcarriers across an RB, and OFDM symbols 9 and 10 may carry MIB in 12 subcarriers across an RB. As a result, an RB may carry MIB in a total of 48 REs (and accordingly 48 symbols), and a central 6 RBs of a system bandwidth may then carry MIB in a total of 288 symbols.

The 288 symbols of MIB may correspond to a 576-bit input to modulation circuitry 720. Meanwhile, the 40-bit MIB payload may correspond to a 120-bit input to rate-matching circuitry 710. In turn, scenario 700 may employ an integer N for rate-matching circuitry 710 having a value of 5, and rate-matching circuitry 710 may repeat the MIB payload 5 times for a total of 600 bits. The number of symbols that may be carried in MIB in a central 6 RBs of a system bandwidth may accordingly correspond to fewer than the number of bits that may be output from rate-matching circuitry 710. As a result, 24 bits may be punctured from the tail-end of the bits output from rate-matching circuitry 710, and 24 bits may be padded to the tail-end of the bits input to de-rate-matching circuitry 760.

Figure 8:
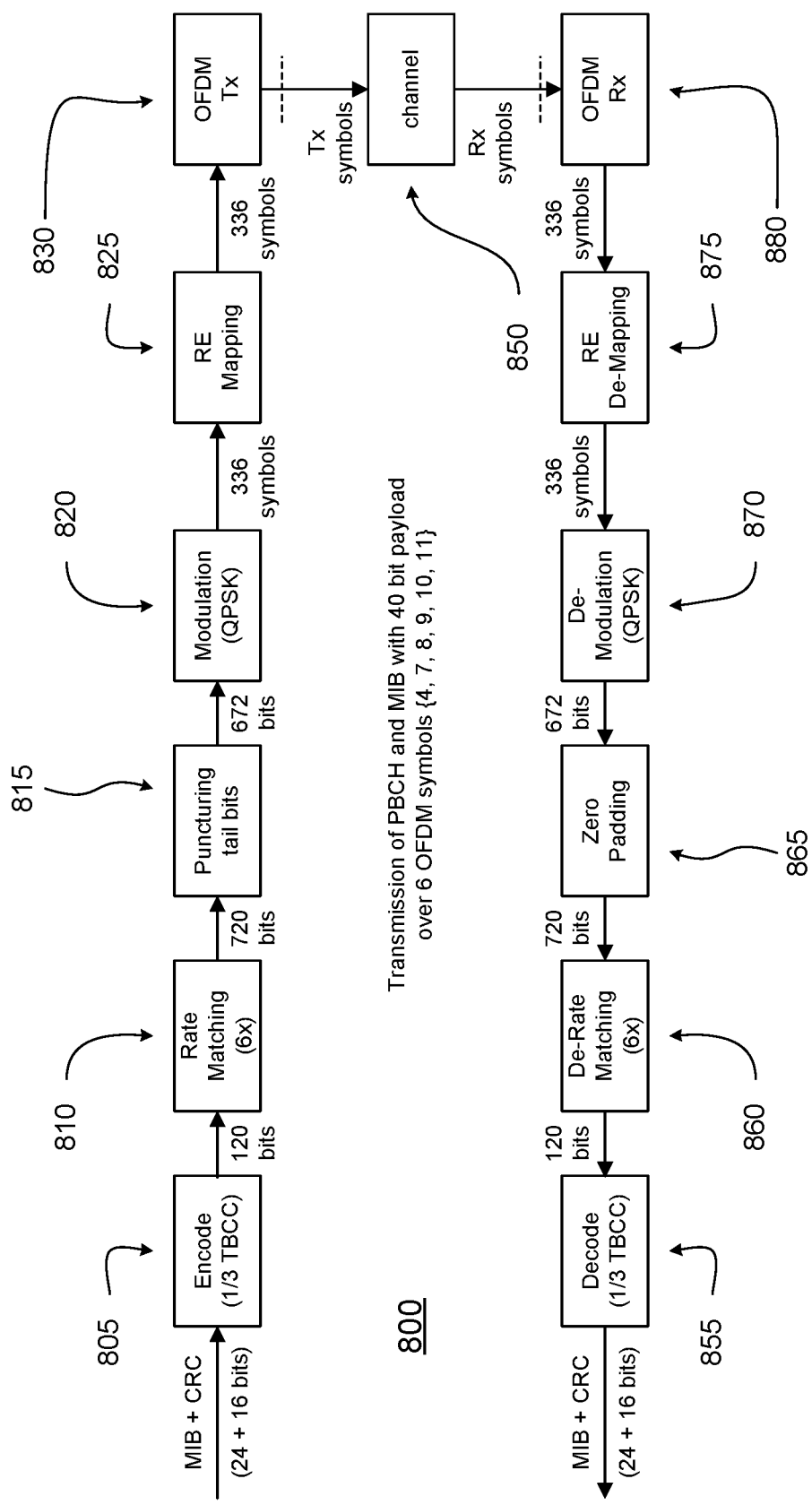

FIG. 8 illustrates a scenario 800 comprising an encoding circuitry 805, a rate matching circuitry 810, a puncturing circuitry 815, a modulating circuitry 820, a mapping circuitry 825, and/or a transmitting circuitry 830 (one or more of which may be implemented in an eNB, or in an apparatus of an eNB). Scenario 800 may also comprise a receiving circuitry 880, a de-mapping circuitry 875, a de-modulating circuitry 870, a zero-padding circuitry 865, a de-rate-matching circuitry 860, and/or a decoding circuitry 855 (one or more of which may be implemented in a UE, or in an apparatus of a UE). The various circuitries of scenario 800 may be similar to the similarly-named circuitries of scenario 200. In scenario 800, transmitting circuitry 830 and receiving circuitry 880 may communicate over a wireless communication channel 850.

In scenario 800, MIB may be transmitted over OFDM symbols 4, 7, 8, 9, 10, and 11, and may have a 40 bit payload. As discussed above, OFDM symbols 4, 7, 8, and 11 may carry MIB in 8 subcarriers across an RB, and OFDM symbols 9 and 10 may carry MIB in 12 subcarriers across an RB. As a result, an RB may carry MIB in a total of 56 REs (and accordingly 56 symbols), and a central 6 RBs of a system bandwidth may then carry MIB in a total of 336 symbols.

The 336 symbols of MIB may correspond to a 672-bit input to modulation circuitry 820. Meanwhile, the 40-bit MIB payload may correspond to a 120-bit input to rate-matching circuitry 810. In turn, scenario 800 may employ an integer N for rate-matching circuitry 810 having a value of 6, and rate-matching circuitry 810 may repeat the MIB payload 6 times for a total of 720 bits. The number of symbols that may be carried in MIB in a central 6 RBs of a system bandwidth may accordingly correspond to fewer than the number of bits that may be output from rate-matching circuitry 810. As a result, 48 bits may be punctured from the tail-end of the bits output from rate-matching circuitry 810, and 48 bits may be padded to the tail-end of the bits input to de-rate-matching circuitry 860.

Figure 9:
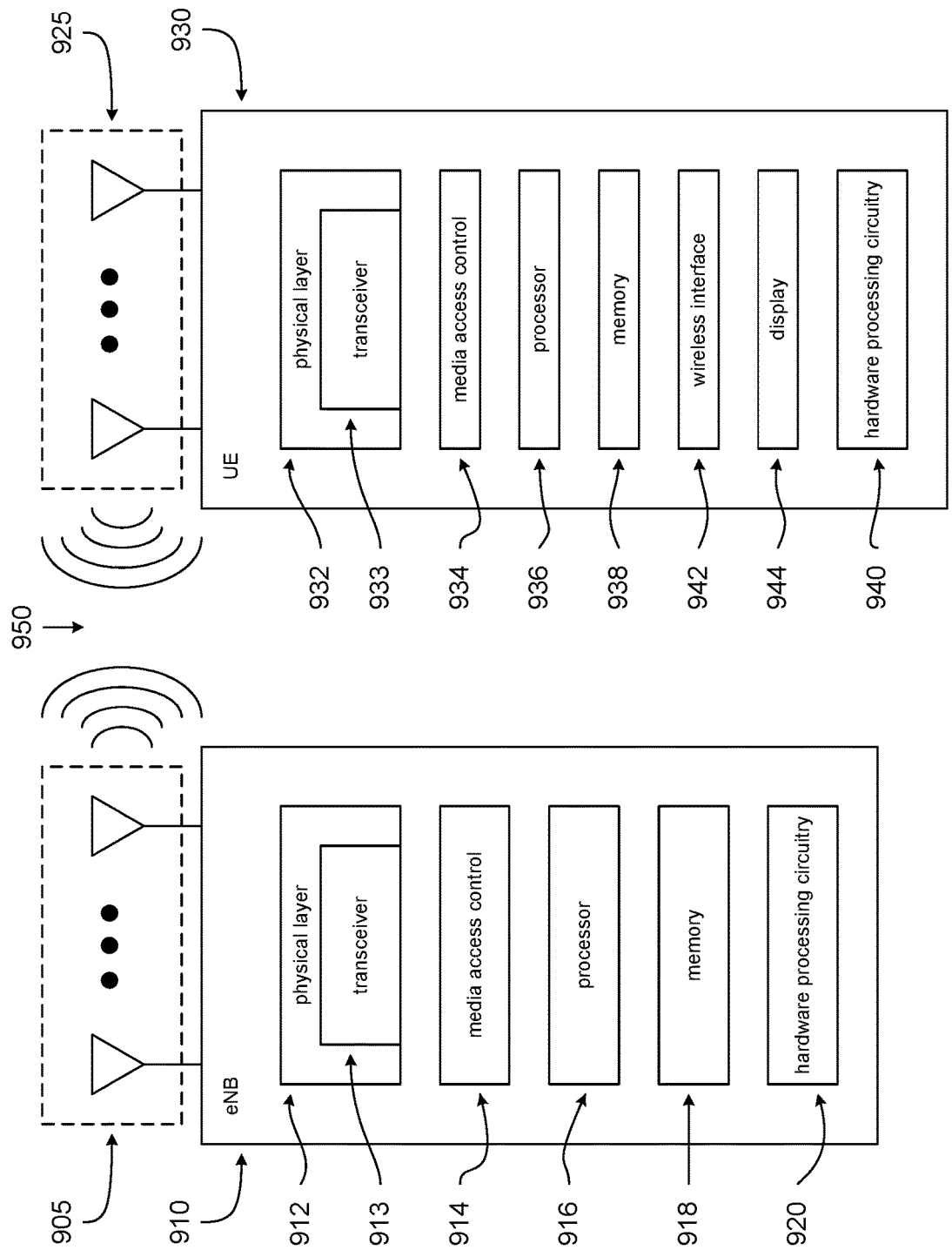
FIG. 9 illustrates an Evolved Node B (eNB) and a User Equipment (UE), in accordance with some embodiments of the disclosure.

FIG. 9 illustrates an eNB and a UE, in accordance with some embodiments of the disclosure. FIG. 9 includes block diagrams of an eNB 910 and a UE 930 which are operable to co-exist with each other and other elements of an LTE network. High-level, simplified architectures of eNB 910 and UE 930 are described so as not to obscure the embodiments. It should be noted that in some embodiments, eNB 910 may be a stationary non-mobile device.

eNB 910 is coupled to one or more antennas 905, and UE 930 is similarly coupled to one or more antennas 925. However, in some embodiments, eNB 910 may incorporate or comprise antennas 905, and UE 930 in various embodiments may incorporate or comprise antennas 925.

In some embodiments, antennas 905 and/or antennas 925 may comprise one or more directional or omni-directional antennas, including monopole antennas, dipole antennas, loop antennas, patch antennas, microstrip antennas, coplanar wave antennas, or other types of antennas suitable for transmission of RF signals. In some MIMO (multiple-input and multiple output) embodiments, antennas 905 are separated to take advantage of spatial diversity.

eNB 910 and UE 930 are operable to communicate with each other on a network, such as a wireless network. eNB 910 and UE 930 may be in communication with each other over a wireless communication channel 950, which has both a downlink path from eNB 910 to UE 930 and an uplink path from UE 930 to eNB 910.

As illustrated in FIG. 9, in some embodiments, eNB 910 may include a physical layer circuitry 912, a MAC (media access control) circuitry 914, a processor 916, a memory 918, and a hardware processing circuitry 920. A person skilled in the art will appreciate that other components not shown may be used in addition to the components shown to form a complete eNB.

In some embodiments, physical layer circuitry 912 includes a transceiver 913 for providing signals to and from UE 930. Transceiver 913 provides signals to and from UEs or other devices using one or more antennas 905. In some embodiments, MAC circuitry 914 controls access to the wireless medium. Memory 918 may be, or may include, a storage media/medium such as a magnetic storage media (e.g., magnetic tapes or magnetic disks), an optical storage media (e.g., optical discs), an electronic storage media (e.g., conventional hard disk drives, solid-state disk drives, or flash-memory-based storage media), or any tangible storage media or non-transitory storage media. Hardware processing circuitry 920 may comprise logic devices or circuitry to perform various operations. In some embodiments, processor 916 and memory 918 are arranged to perform the operations of hardware processing circuitry 920, such as operations described herein with reference to logic devices and circuitry within eNB 910 and/or hardware processing circuitry 920.

Accordingly, in some embodiments, eNB 910 may be a device comprising an application processor, a memory, one or more antenna ports, and an interface for allowing the application processor to communicate with another device.

As is also illustrated in FIG. 9, in some embodiments, UE 930 may include a physical layer circuitry 932, a MAC circuitry 934, a processor 936, a memory 938, a hardware processing circuitry 940, a wireless interface 942, and a display 944. A person skilled in the art would appreciate that other components not shown may be used in addition to the components shown to form a complete UE.

In some embodiments, physical layer circuitry 932 includes a transceiver 933 for providing signals to and from eNB 910 (as well as other eNBs). Transceiver 933 provides signals to and from eNBs or other devices using one or more antennas 925. In some embodiments, MAC circuitry 934 controls access to the wireless medium. Memory 938 may be, or may include, a storage media/medium such as a magnetic storage media (e.g., magnetic tapes or magnetic disks), an optical storage media (e.g., optical discs), an electronic storage media (e.g., conventional hard disk drives, solid-state disk drives, or flash-memory-based storage media), or any tangible storage media or non-transitory storage media. Wireless interface 942 may be arranged to allow the processor to communicate with another device. Display 944 may provide a visual and/or tactile display for a user to interact with UE 930, such as a touch-screen display. Hardware processing circuitry 940 may comprise logic devices or circuitry to perform various operations. In some embodiments, processor 936 and memory 938 may be arranged to perform the operations of hardware processing circuitry 940, such as operations described herein with reference to logic devices and circuitry within UE 930 and/or hardware processing circuitry 940.

Accordingly, in some embodiments, UE 930 may be a device comprising an application processor, a memory, one or more antennas, a wireless interface for allowing the application processor to communicate with another device, and a touch-screen display.

Elements of FIG. 9, and elements of other figures having the same names or reference numbers, can operate or function in the manner described herein with respect to any such figures (although the operation and function of such elements is not limited to such descriptions). For example, FIGS. 10-11 and 14 also depict embodiments of eNBs, hardware processing circuitry of eNBs, UEs, and/or hardware processing circuitry of UEs, and the embodiments described with respect to FIG. 9 and FIGS. 10-11 and 14 can operate or function in the manner described herein with respect to any of the figures.

In addition, although eNB 910 and UE 930 are each described as having several separate functional elements, one or more of the functional elements may be combined and may be implemented by combinations of software-configured elements and/or other hardware elements. In some embodiments of this disclosure, the functional elements can refer to one or more processes operating on one or more processing elements. Examples of software and/or hardware configured elements include Digital Signal Processors (DSPs), one or more microprocessors, DSPs, Field-Programmable Gate Arrays (FPGAs), Application Specific Integrated Circuits (ASICs), Radio-Frequency Integrated Circuits (RFICs), and so on.

Figure 10:
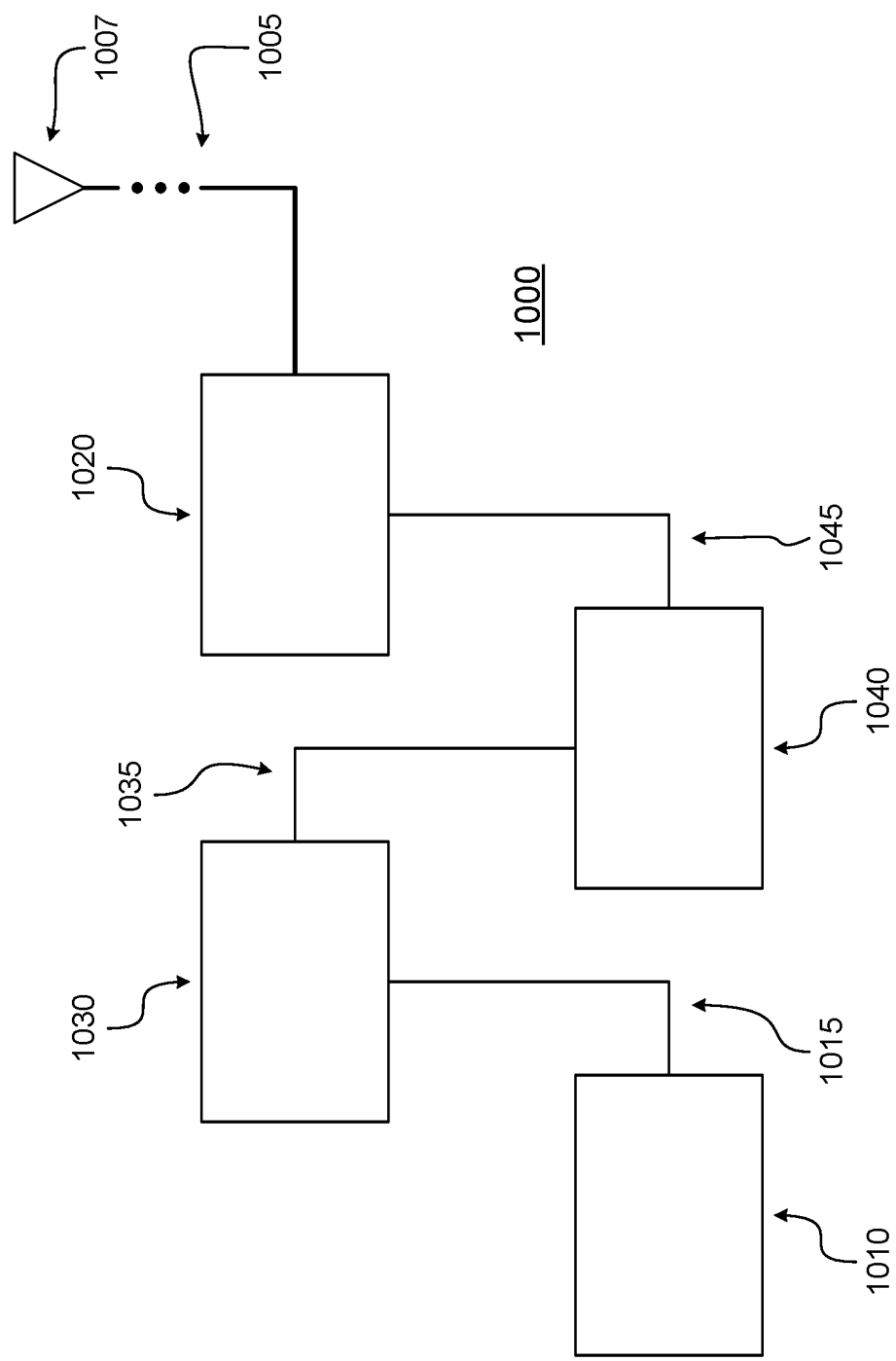
FIG. 10 illustrates hardware processing circuitries for an eNB for mechanisms for transmitting MIB in standalone systems, in accordance with some embodiments of the disclosure.

FIG. 10 illustrates hardware processing circuitries for an eNB for mechanisms for transmitting MIB in standalone systems, in accordance with some embodiments of the disclosure. With reference to FIG. 9, an eNB may include various hardware processing circuitries discussed below (such as hardware processing circuitry 1000 of FIG. 10), which may in turn comprise logic devices and/or circuitry operable to perform various operations. For example, in FIG. 9, eNB 910 (or various elements or components therein, such as hardware processing circuitry 920, or combinations of elements or components therein) may include part of, or all of, these hardware processing circuitries.

In some embodiments, one or more devices or circuitries within these hardware processing circuitries may be implemented by combinations of software-configured elements and/or other hardware elements. For example, processor 916 (and/or one or more other processors which eNB 910 may comprise), memory 918, and/or other elements or components of eNB 910 (which may include hardware processing circuitry 920) may be arranged to perform the operations of these hardware processing circuitries, such as operations described herein with reference to devices and circuitry within these hardware processing circuitries. In some embodiments, processor 916 (and/or one or more other processors which eNB 910 may comprise) may be a baseband processor.

Returning to FIG. 10, an apparatus of eNB 910 (or another eNB or base station), which may be operable to communicate with one or more UEs on a wireless network, may comprise hardware processing circuitry 1000. In some embodiments, hardware processing circuitry 1000 may comprise one or more antenna ports 1005 operable to provide various transmissions over a wireless communication channel (such as wireless communication channel 950). Antenna ports 1005 may be coupled to one or more antennas 1007 (which may be antennas 905). In some embodiments, hardware processing circuitry 1000 may incorporate antennas 1007, while in other embodiments, hardware processing circuitry 1000 may merely be coupled to antennas 1007.

Antenna ports 1005 and antennas 1007 may be operable to provide signals from an eNB to a wireless communications channel and/or a UE, and may be operable to provide signals from a UE and/or a wireless communications channel to an eNB. For example, antenna ports 1005 and antennas 1007 may be operable to provide transmissions from eNB 910 to wireless communication channel 950 (and from there to UE 930, or to another UE). Similarly, antennas 1007 and antenna ports 1005 may be operable to provide transmissions from a wireless communication channel 950 (and beyond that, from UE 930, or another UE) to eNB 910.

Hardware processing circuitry 1000 may comprise various circuitries operable in accordance with the various embodiments discussed herein. With reference to FIG. 10, hardware processing circuitry 1000 may comprise a first circuitry 1010, a second circuitry 1020, a third circuitry 1030, and/or a fourth circuitry 1040. First circuitry 1010 may be operable to generate a MIB for transmission on a PRB spanning a plurality of OFDM symbols, the MIB carrying a subframe index comprising three bits. First circuitry 1010 may provide the MIB over an interface 1015 (which may be coupled to second circuitry 1020 through third circuitry 1030 and fourth circuitry 1040). Second circuitry 1020 may be operable to map the MIB onto at least one OFDM symbol of the PRB outside of symbols 7, 8, 9, and 10. Transmission of the PRB may be subject to a LBT procedure.

In some embodiments, the subframe index may be an subframe offset from the start of a half radio frame. For some embodiments, the subframe index may comprise four bits. In some embodiments, the MIB may comprise 28 bits plus a number of bits X, wherein X is an integer other than 12.

For some embodiments, second circuitry 1020 may be operable to map the MIB onto OFDM symbols 4, 7, 8, 9, 10, and 11 of the PRB. In some embodiments, the MIB may carry a bandwidth indicator comprising one bit, a SFN indicator comprising eight bits, and a CRC field comprising 16 bits.

For some embodiments, third circuitry 1030 may be operable to encode the MIB with a one-third rate TBCC. Third circuitry 1030 may provide the encoded MIB over an interface 1035 (which may be coupled to fourth circuitry 1040 and/or to second circuitry 1020 through fourth circuitry 1040). In some embodiments, fourth circuitry 1040 may be operable to rate-match the MIB an integer number of times N. Fourth circuitry 1040 may provide the rate-matched MIB to second circuitry 1020 over an interface 1045.

In some embodiments, first circuitry 1010, second circuitry 1020, third circuitry 1030, and/or fourth circuitry 1040 may be implemented as separate circuitries. In other embodiments, first circuitry 1010, second circuitry 1020, third circuitry 1030, and/or fourth circuitry 1040 may be combined and implemented together in a circuitry without altering the essence of the embodiments.

Figure 11:
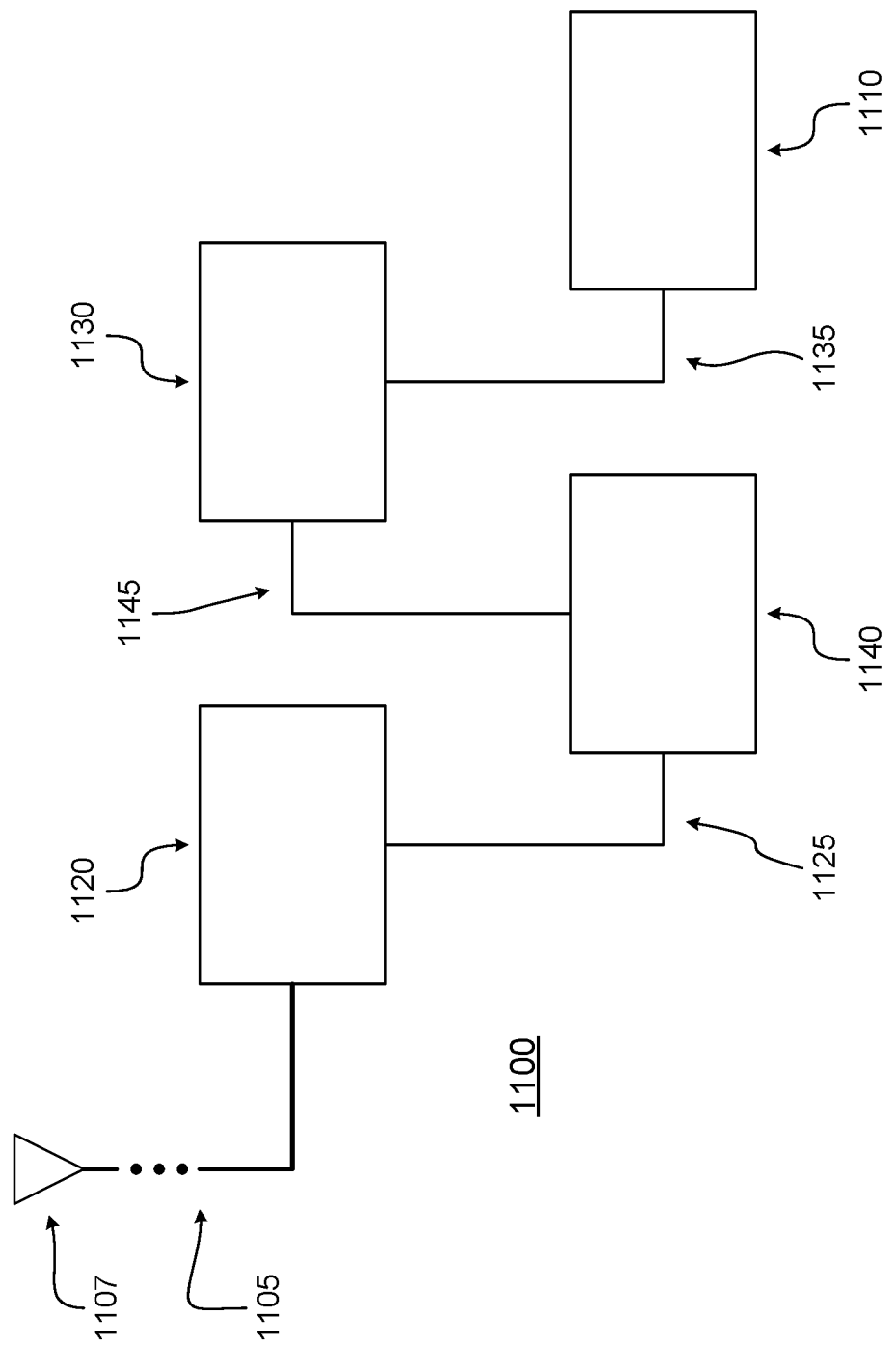
FIG. 11 illustrates hardware processing circuitries for a UE for mechanisms for transmitting MIB in standalone systems, in accordance with some embodiments of the disclosure.

FIG. 11 illustrates hardware processing circuitries for a UE for mechanisms for transmitting MIB in standalone systems, in accordance with some embodiments of the disclosure. With reference to FIG. 9, a UE may include various hardware processing circuitries discussed below (such as hardware processing circuitry 1100 of FIG. 11), which may in turn comprise logic devices and/or circuitry operable to perform various operations. For example, in FIG. 9, UE 930 (or various elements or components therein, such as hardware processing circuitry 940, or combinations of elements or components therein) may include part of, or all of, these hardware processing circuitries.

In some embodiments, one or more devices or circuitries within these hardware processing circuitries may be implemented by combinations of software-configured elements and/or other hardware elements. For example, processor 936 (and/or one or more other processors which UE 930 may comprise), memory 938, and/or other elements or components of UE 930 (which may include hardware processing circuitry 940) may be arranged to perform the operations of these hardware processing circuitries, such as operations described herein with reference to devices and circuitry within these hardware processing circuitries. In some embodiments, processor 936 (and/or one or more other processors which UE 930 may comprise) may be a baseband processor.

Returning to FIG. 11, an apparatus of UE 930 (or another UE or mobile handset), which may be operable to communicate with one or more eNBs on a wireless network, may comprise hardware processing circuitry 1100. In some embodiments, hardware processing circuitry 1100 may comprise one or more antenna ports 1105 operable to provide various transmissions over a wireless communication channel (such as wireless communication channel 950). Antenna ports 1105 may be coupled to one or more antennas 1107 (which may be antennas 925). In some embodiments, hardware processing circuitry 1100 may incorporate antennas 1107, while in other embodiments, hardware processing circuitry 1100 may merely be coupled to antennas 1107.

Antenna ports 1105 and antennas 1107 may be operable to provide signals from a UE to a wireless communications channel and/or an eNB, and may be operable to provide signals from an eNB and/or a wireless communications channel to a UE. For example, antenna ports 1105 and antennas 1107 may be operable to provide transmissions from UE 930 to wireless communication channel 950 (and from there to eNB 910, or to another eNB). Similarly, antennas 1107 and antenna ports 1105 may be operable to provide transmissions from a wireless communication channel 950 (and beyond that, from eNB 910, or another eNB) to UE 930.

Hardware processing circuitry 1100 may comprise various circuitries operable in accordance with the various embodiments discussed herein. With reference to FIG. 11, hardware processing circuitry 1100 may comprise a first circuitry 1110, a second circuitry 1120, a third circuitry 1130, and/or a fourth circuitry 1140. First circuitry 1110 may be operable to process a MIB received on a PRB spanning a plurality of OFDM symbols, the MIB carrying a subframe index comprising three bits. Second circuitry 1120 may be operable to de-map the MIB from at least one OFDM symbol of the PRB outside of symbols 7, 8, 9, and 10. Second circuitry 1120 may provide the de-mapped MIB over an interface 1125 (which may be coupled to first circuitry 1110 through fourth circuitry 1140 and third circuitry 1130). The PRB may be received over unlicensed spectrum.

In some embodiments, the subframe index may be an subframe offset from the start of a half radio frame. For some embodiments, the subframe index may comprise four bits. In some embodiments, the MIB may comprise 28 bits plus a number of bits X, wherein X is an integer other than 12.

For some embodiments, second circuitry 1120 may be operable to de-map the MIB from OFDM symbols 4, 7, 8, 9, 10, and 11 of the PRB. In some embodiments, the MIB may carry a bandwidth indicator comprising one bit, a SFN indicator comprising eight bits, and a CRC field comprising 16 bits.

For some embodiments, third circuitry 1130 may be operable to decode the MIB with a one-third rate TBCC. Third circuitry 1130 may provide the decoded MIB over an interface 1135 (which may be coupled to first circuitry 1110). In some embodiments, fourth circuitry 1140 may be operable to de-rate-match the MIB an integer number of times N. Fourth circuitry 1140 may provide the de-rate-matched MIB to third circuitry 1130 over an interface 1145.

In some embodiments, first circuitry 1110, second circuitry 1120, third circuitry 1130, and/or fourth circuitry 1140 may be implemented as separate circuitries. In other embodiments, first circuitry 1110, second circuitry 1120, third circuitry 1130, and fourth circuitry 1140 may be combined and implemented together in a circuitry without altering the essence of the embodiments.

Figure 12:
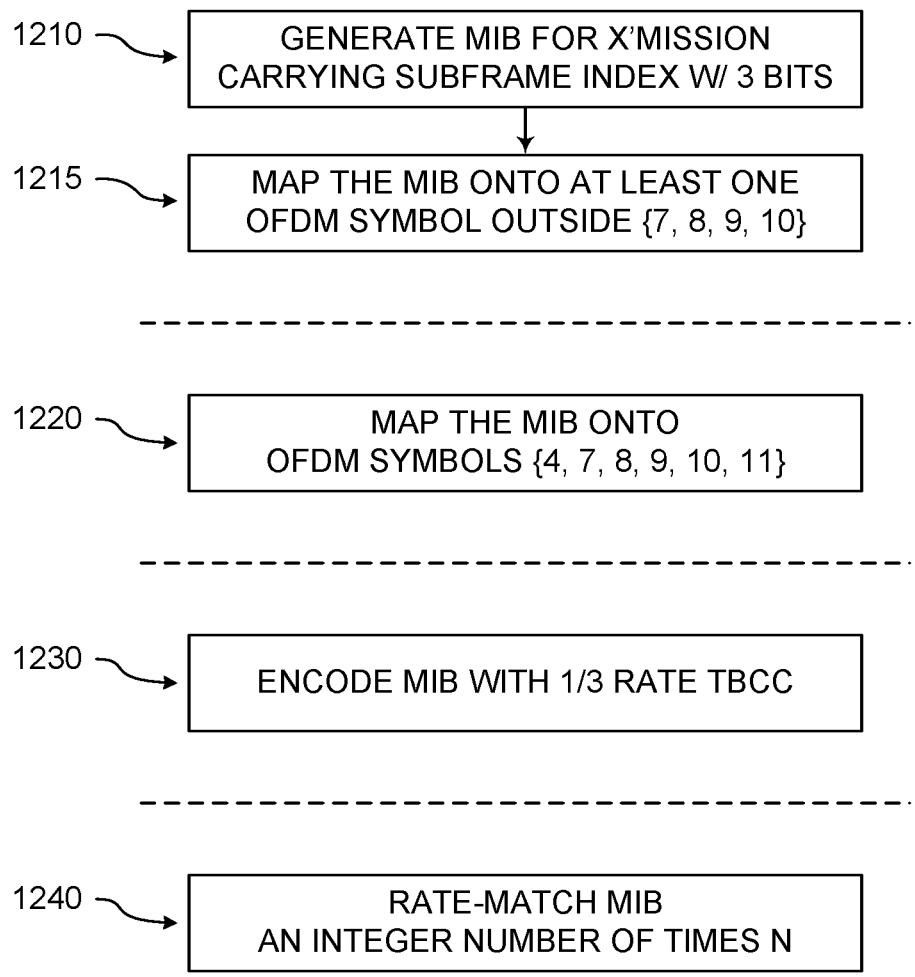
FIG. 12 illustrates methods for an eNB for mechanisms for transmitting MIB in standalone systems, in accordance with some embodiments of the disclosure.

FIG. 12 illustrates methods for an eNB for mechanisms for transmitting MIB in standalone systems, in accordance with some embodiments of the disclosure. With reference to FIG. 9, various methods that may relate to eNB 910 and hardware processing circuitry 920 are discussed below. Although the actions in method 1200 of FIG. 12 are shown in a particular order, the order of the actions can be modified. Thus, the illustrated embodiments can be performed in a different order, and some actions may be performed in parallel. Some of the actions and/or operations listed in FIG. 12 are optional in accordance with certain embodiments. The numbering of the actions presented is for the sake of clarity and is not intended to prescribe an order of operations in which the various actions must occur. Additionally, operations from the various flows may be utilized in a variety of combinations.

Moreover, in some embodiments, machine readable storage media may have executable instructions that, when executed, cause eNB 910 and/or hardware processing circuitry 920 to perform an operation comprising the methods of FIG. 12. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

In some embodiments, an apparatus may comprise means for performing various actions and/or operations of the methods of FIG. 12.

Returning to FIG. 12, various methods may be in accordance with the various embodiments discussed herein. A method 1200 may comprise a generating 1210, a mapping 1215, a mapping 1220, an encoding 1230, and/or a rate-matching 1240. In generating 1210, a MIB may be generated for transmission on a PRB spanning a plurality of OFDM symbols, the MIB carrying a subframe index comprising three bits. In mapping 1215, the MIB may be mapped onto at least one OFDM symbol of the PRB outside of symbols 7, 8, 9, and 10. Transmission of the PRB is subject to a LBT procedure.

In some embodiments, the subframe index may be an subframe offset from the start of a half radio frame. For some embodiments, the subframe index may comprise four bits. In some embodiments, the MIB may comprise 28 bits plus a number of bits X, wherein X is an integer other than 12.

In mapping 1220, the MIB may be mapped onto OFDM symbols 4, 7, 8, 9, 10, and 11 of the PRB. In some embodiments, the MIB may carry a bandwidth indicator comprising one bit, a SFN indicator comprising eight bits, and a CRC field comprising 16 bits.

In encoding 1230, the MIB may be encoded with a one-third rate TBCC. In rate-matching 1240, the MIB may be rate-matched an integer number of times N.

Figure 13:
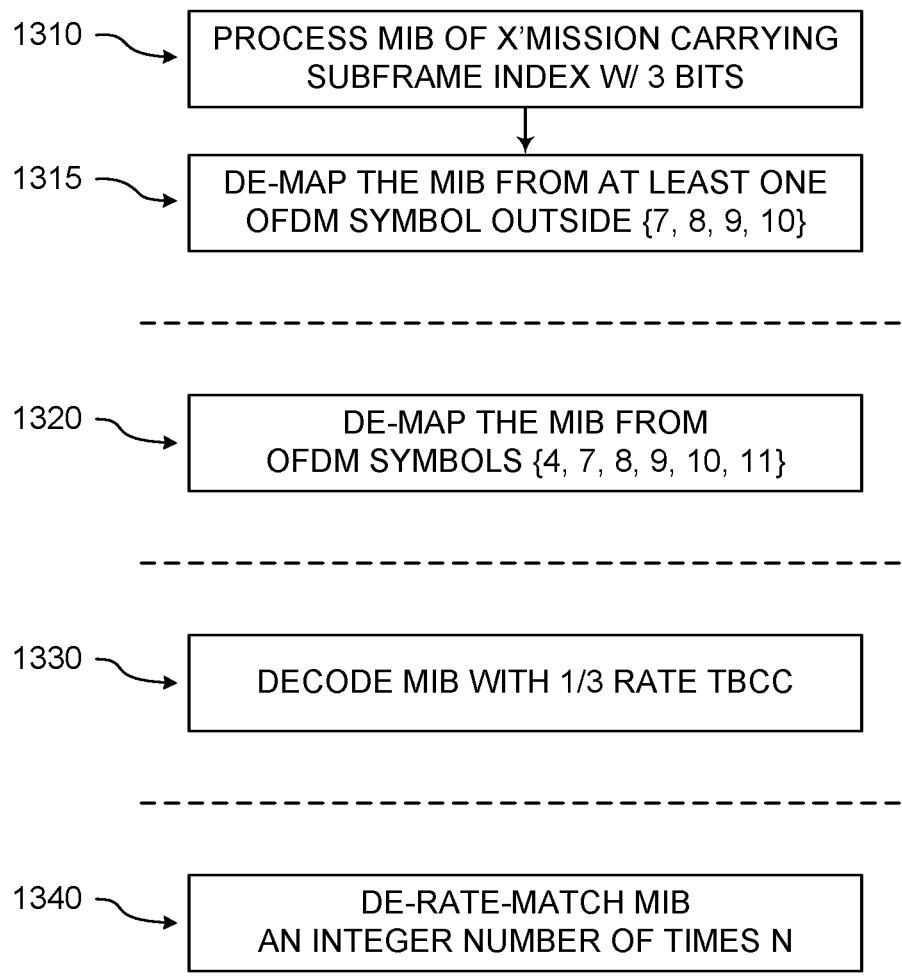
FIG. 13 illustrates methods for a UE for mechanisms for transmitting MIB in standalone systems, in accordance with some embodiments of the disclosure.

FIG. 13 illustrates methods for a UE for mechanisms for transmitting MIB in standalone systems, in accordance with some embodiments of the disclosure. With reference to FIG. 9, methods that may relate to UE 930 and hardware processing circuitry 940 are discussed below. Although the actions in the method 1300 of FIG. 13 are shown in a particular order, the order of the actions can be modified. Thus, the illustrated embodiments can be performed in a different order, and some actions may be performed in parallel. Some of the actions and/or operations listed in FIG. 13 are optional in accordance with certain embodiments. The numbering of the actions presented is for the sake of clarity and is not intended to prescribe an order of operations in which the various actions must occur. Additionally, operations from the various flows may be utilized in a variety of combinations.

Moreover, in some embodiments, machine readable storage media may have executable instructions that, when executed, cause UE 930 and/or hardware processing circuitry 940 to perform an operation comprising the methods of FIG. 13. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

In some embodiments, an apparatus may comprise means for performing various actions and/or operations of the methods of FIG. 13.

Returning to FIG. 13, various methods may be in accordance with the various embodiments discussed herein. A method 1300 may comprise a processing 1310, a de-mapping 1315, a de-mapping 1320, a decoding 1330, and/or a de-rating 1340. In processing 1310, a MIB received on a PRB spanning a plurality of OFDM symbols may be processed, the MIB carrying a subframe index comprising three bits. In de-mapping 1315, MIB may be de-mapped from at least one OFDM symbol of the PRB outside of symbols 7, 8, 9, and 10. The PRB may be received over unlicensed spectrum.

In some embodiments, the subframe index may be an subframe offset from the start of a half radio frame. For some embodiments, the subframe index may comprise four bits. In some embodiments, the MIB may comprise 28 bits plus a number of bits X, wherein X is an integer other than 12.

In de-mapping 1320, the MIB may be de-mapped from OFDM symbols 4, 7, 8, 9, 10, and 11 of the PRB. In some embodiments, the MIB may carry a bandwidth indicator comprising one bit, a SFN indicator comprising eight bits, and a CRC field comprising 16 bits.

In decoding 1330, the MIB may be decoded with a one-third rate TBCC. In de-rate-matching 1340, the MIB may be de-rate-matched an integer number of times N.

Figure 14:
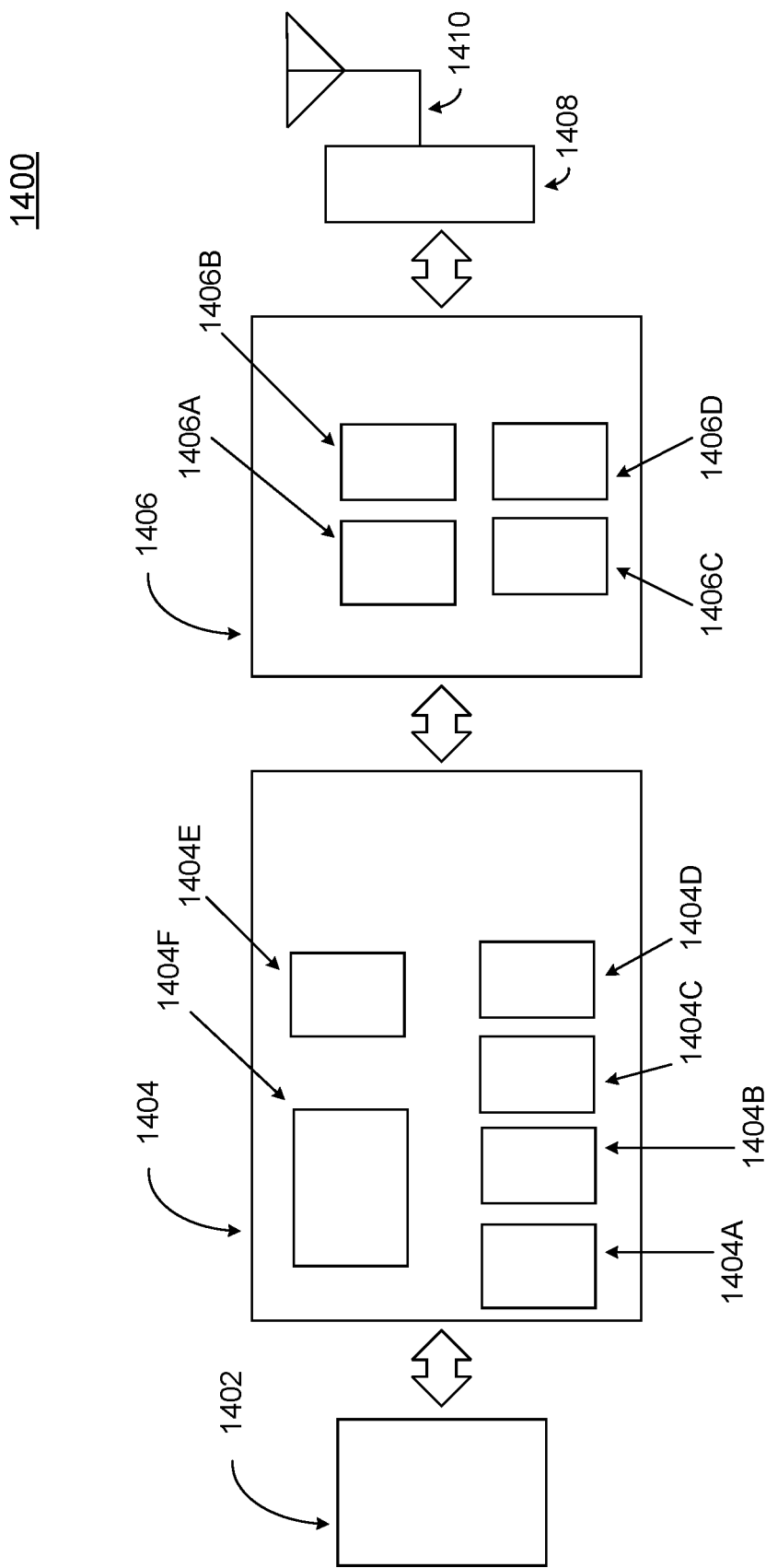
FIG. 14 illustrates example components of a UE device, in accordance with some embodiments of the disclosure.

FIG. 14 illustrates example components of a UE device, in accordance with some embodiments of the disclosure. In some embodiments, a UE device 1400 may include application circuitry 1402, baseband circuitry 1404, Radio Frequency (RF) circuitry 1406, front-end module (FEM) circuitry 1408, a low-power wake-up receiver (LP-WUR), and one or more antennas 1410, coupled together at least as shown. In some embodiments, the UE device 1400 may include additional elements such as, for example, memory/storage, display, camera, sensor, and/or input/output (I/O) interface.

The application circuitry 1402 may include one or more application processors. For example, the application circuitry 1402 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 1404 may include circuitry such as, but not limited to, one or more single-core or multi-core processors. The baseband circuitry 1404 may include one or more baseband processors and/or control logic to process baseband signals received from a receive signal path of the RF circuitry 1406 and to generate baseband signals for a transmit signal path of the RF circuitry 1406. Baseband processing circuity 1404 may interface with the application circuitry 1402 for generation and processing of the baseband signals and for controlling operations of the RF circuitry 1406. For example, in some embodiments, the baseband circuitry 1404 may include a second generation (2G) baseband processor 1404A, third generation (3G) baseband processor 1404B, fourth generation (4G) baseband processor 1404C, and/or other baseband processor(s) 1404D for other existing generations, generations in development or to be developed in the future (e.g., fifth generation (5G), 6G, etc.). The baseband circuitry 1404 (e.g., one or more of baseband processors 1404A-D) may handle various radio control functions that enable communication with one or more radio networks via the RF circuitry 1406. The radio control functions may include, but are not limited to, signal modulation/demodulation, encoding/decoding, radio frequency shifting, etc. In some embodiments, modulation/demodulation circuitry of the baseband circuitry 1404 may include Fast-Fourier Transform (FFT), precoding, and/or constellation mapping/demapping functionality. In some embodiments, encoding/decoding circuitry of the baseband circuitry 1404 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 1404 may include elements of a protocol stack such as, for example, elements of an EUTRAN protocol including, for example, physical (PHY), media access control (MAC), radio link control (RLC), packet data convergence protocol (PDCP), and/or RRC elements. A central processing unit (CPU) 1404E of the baseband circuitry 1404 may be configured to run elements of the protocol stack for signaling of the PHY, MAC, RLC, PDCP and/or RRC layers. In some embodiments, the baseband circuitry may include one or more audio digital signal processor(s) (DSP) 1404F. The audio DSP(s) 1404F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 1404 and the application circuitry 1402 may be implemented together such as, for example, on a system on a chip (SOC).

In some embodiments, the baseband circuitry 1404 may provide for communication compatible with one or more radio technologies. For example, in some embodiments, the baseband circuitry 1404 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 1404 is configured to support radio communications of more than one wireless protocol may be referred to as multi-mode baseband circuitry.

RF circuitry 1406 may enable communication with wireless networks using modulated electromagnetic radiation through a non-solid medium. In various embodiments, the RF circuitry 1406 may include switches, filters, amplifiers, etc. to facilitate the communication with the wireless network. RF circuitry 1406 may include a receive signal path which may include circuitry to down-convert RF signals received from the FEM circuitry 1408 and provide baseband signals to the baseband circuitry 1404. RF circuitry 1406 may also include a transmit signal path which may include circuitry to up-convert baseband signals provided by the baseband circuitry 1404 and provide RF output signals to the FEM circuitry 1408 for transmission.

In some embodiments, the RF circuitry 1406 may include a receive signal path and a transmit signal path. The receive signal path of the RF circuitry 1406 may include mixer circuitry 1406A, amplifier circuitry 1406B and filter circuitry 1406C. The transmit signal path of the RF circuitry 1406 may include filter circuitry 1406C and mixer circuitry 1406A. RF circuitry 1406 may also include synthesizer circuitry 1406D for synthesizing a frequency for use by the mixer circuitry 1406A of the receive signal path and the transmit signal path. In some embodiments, the mixer circuitry 1406A of the receive signal path may be configured to down-convert RF signals received from the FEM circuitry 1408 based on the synthesized frequency provided by synthesizer circuitry 1406D. The amplifier circuitry 1406B may be configured to amplify the down-converted signals and the filter circuitry 1406C may be a low-pass filter (LPF) or band-pass filter (BPF) configured to remove unwanted signals from the down-converted signals to generate output baseband signals. Output baseband signals may be provided to the baseband circuitry 1404 for further processing. In some embodiments, the output baseband signals may be zero-frequency baseband signals, although this is not a requirement. In some embodiments, mixer circuitry 1406A of the receive signal path may comprise passive mixers, although the scope of the embodiments is not limited in this respect.

In some embodiments, the mixer circuitry 1406A of the transmit signal path may be configured to up-convert input baseband signals based on the synthesized frequency provided by the synthesizer circuitry 1406D to generate RF output signals for the FEM circuitry 1408. The baseband signals may be provided by the baseband circuitry 1404 and may be filtered by filter circuitry 1406C. The filter circuitry 1406C may include a low-pass filter (LPF), although the scope of the embodiments is not limited in this respect.

In some embodiments, the mixer circuitry 1406A of the receive signal path and the mixer circuitry 1406A of the transmit signal path may include two or more mixers and may be arranged for quadrature down-conversion and/or up-conversion respectively. In some embodiments, the mixer circuitry 1406A of the receive signal path and the mixer circuitry 1406A of the transmit signal path may include two or more mixers and may be arranged for image rejection (e.g., Hartley image rejection). In some embodiments, the mixer circuitry 1406A of the receive signal path and the mixer circuitry 1406A may be arranged for direct down-conversion and/or direct up-conversion, respectively. In some embodiments, the mixer circuitry 1406A of the receive signal path and the mixer circuitry 1406A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 1406 may include analog-to-digital converter (ADC) and digital-to-analog converter (DAC) circuitry and the baseband circuitry 1404 may include a digital baseband interface to communicate with the RF circuitry 1406.

In some dual-mode embodiments, a separate radio IC circuitry may be provided for processing signals for each spectrum, although the scope of the embodiments is not limited in this respect.

In some embodiments, the synthesizer circuitry 1406D may be a fractional-N synthesizer or a fractional N/N+1 synthesizer, although the scope of the embodiments is not limited in this respect as other types of frequency synthesizers may be suitable. For example, synthesizer circuitry 1406D may be a delta-sigma synthesizer, a frequency multiplier, or a synthesizer comprising a phase-locked loop with a frequency divider.

The synthesizer circuitry 1406D may be configured to synthesize an output frequency for use by the mixer circuitry 1406A of the RF circuitry 1406 based on a frequency input and a divider control input. In some embodiments, the synthesizer circuitry 1406D may be a fractional N/N+1 synthesizer.

In some embodiments, frequency input may be provided by a voltage controlled oscillator (VCO), although that is not a requirement. Divider control input may be provided by either the baseband circuitry 1404 or the applications processor 1402 depending on the desired output frequency. In some embodiments, a divider control input (e.g., N) may be determined from a look-up table based on a channel indicated by the applications processor 1402.

Synthesizer circuitry 1406D of the RF circuitry 1406 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 1406D may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 1406 may include an IQ/polar converter.

FEM circuitry 1408 may include a receive signal path which may include circuitry configured to operate on RF signals received from one or more antennas 1410, amplify the received signals and provide the amplified versions of the received signals to the RF circuitry 1406 for further processing. FEM circuitry 1408 may also include a transmit signal path which may include circuitry configured to amplify signals for transmission provided by the RF circuitry 1406 for transmission by one or more of the one or more antennas 1410.

In some embodiments, the FEM circuitry 1408 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 1406). The transmit signal path of the FEM circuitry 1408 may include a power amplifier (PA) to amplify input RF signals (e.g., provided by RF circuitry 1406), and one or more filters to generate RF signals for subsequent transmission (e.g., by one or more of the one or more antennas 1410.

In some embodiments, the UE 1400 comprises a plurality of power saving mechanisms. If the UE 1400 is in an RRC_Connected state, where it is still connected to the eNB as it expects to receive traffic shortly, then it may enter a state known as Discontinuous Reception Mode (DRX) after a period of inactivity. During this state, the device may power down for brief intervals of time and thus save power.

If there is no data traffic activity for an extended period of time, then the UE 1400 may transition off to an RRC_Idle state, where it disconnects from the network and does not perform operations such as channel quality feedback, handover, etc. The UE 1400 goes into a very low power state and it performs paging where again it periodically wakes up to listen to the network and then powers down again. Since the device might not receive data in this state, in order to receive data, it should transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

In addition, in various embodiments, an eNB device may include components substantially similar to one or more of the example components of UE device 1400 described herein.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 provides an apparatus of an Evolved Node B (eNB) operable to communicate with a User Equipment (UE) on a wireless network, comprising: a memory to store instructions; and one or more processors to: generate a Master Information Block (MIB) for transmission on one or more Physical Resource Blocks (PRBs) spanning a plurality of Orthogonal Frequency Division Multiplex (OFDM) symbols, the MIB carrying a subframe index comprising three bits; and map the MIB onto at least one OFDM symbol of the PRBs outside of symbols 7, 8, 9, and 10, wherein transmission of the PRBs is subject to a Listen Before Talk (LBT) procedure.

In example 2, the apparatus of example 1, wherein the subframe index is an subframe offset from the start of a half radio frame.

In example 3, the apparatus of any of examples 1 through 2, wherein the subframe index comprises four bits.

In example 4, the apparatus of any of examples 1 through 3, wherein the MIB comprises 28 bits plus a number of bits X, wherein X is an integer other than 12.

In example 5, the apparatus of either of examples 1 or 4, wherein the one or more processors are to: map the MIB onto OFDM symbols 4, 7, 8, 9, 10, and 11 of the PRBs.

In example 6, the apparatus of any of examples 1 through 5, wherein the MIB carries a bandwidth indicator comprising one bit, a Subframe Number (SFN) indicator comprising eight bits, and a Cyclic Redundancy Check (CRC) field comprising 16 bits.

In example 7, the apparatus of any of examples 1 through 6, wherein the one or more processors are to: encode the MIB with a one-third rate Tail-Bit Convolutional Code (TBCC).

In example 8, the apparatus of any of examples 1 through 7, wherein the one or more processors are to: rate-match the MIB an integer number of times N.

In example 9, the apparatus of any of examples 1 through 8, wherein the one or more processors are to: puncture a number Y of bits from the tail of the MIB.

Example 10 provides an Evolved Node B (eNB) device comprising an application processor, a memory, one or more antenna ports, and an interface for allowing the application processor to communicate with another device, the eNB device including the apparatus of any of examples 1 through 9.

Example 11 provides a method comprising: generating a Master Information Block (MIB) for transmission on one or more Physical Resource Blocks (PRBs) spanning a plurality of Orthogonal Frequency Division Multiplex (OFDM) symbols, the MIB carrying a subframe index comprising three bits; and mapping the MIB onto at least one OFDM symbol of the PRBs outside of symbols 7, 8, 9, and 10, wherein transmission of the PRBs is subject to a Listen Before Talk (LBT) procedure.

In example 12, the method of example 11, wherein the subframe index is an subframe offset from the start of a half radio frame.

In example 13, the method of either of examples 11 or 12, wherein the subframe index comprises four bits.

In example 14, the method of any of examples 11 through 13, wherein the MIB comprises 28 bits plus a number of bits X, wherein X is an integer other than 12.

In example 15, the method of any of examples 11 through 14, the operation comprising: mapping the MIB onto OFDM symbols 4, 7, 8, 9, 10, and 11 of the PRBs.

In example 16, the method of any of examples 11 through 15, wherein the MIB carries a bandwidth indicator comprising one bit, a Subframe Number (SFN) indicator comprising eight bits, and a Cyclic Redundancy Check (CRC) field comprising 16 bits.

In example 17, the method of any of examples 11 through 16, the operation comprising: encoding the MIB with a one-third rate Tail-Bit Convolutional Code (TBCC).

In example 18, the method of any of examples 11 through 17, the operation comprising: rate-matching the MIB an integer number of times N.

In example 19, the method of any of examples 11 through 18, the operation comprising: puncturing a number Y of bits from the tail of the MIB.

Example 20 provides machine readable storage media having machine executable instructions stored thereon that, when executed, cause one or more processors to perform a method according to any of examples 11 through 19.

Example 21 provides an apparatus of an Evolved Node B (eNB) operable to communicate with a User Equipment (UE) on a wireless network, comprising: means for generating a Master Information Block (MIB) for transmission on one or more Physical Resource Blocks (PRBs) spanning a plurality of Orthogonal Frequency Division Multiplex (OFDM) symbols, the MIB carrying a subframe index comprising three bits; and means for mapping the MIB onto at least one OFDM symbol of the PRBs outside of symbols 7, 8, 9, and 10, wherein transmission of the PRBs is subject to a Listen Before Talk (LBT) procedure.

In example 22, the apparatus of example 21, wherein the subframe index is an subframe offset from the start of a half radio frame.

In example 23, the apparatus of either of examples 21 or 22, wherein the subframe index comprises four bits.

In example 24, the apparatus of any of examples 21 through 23, wherein the MIB comprises 28 bits plus a number of bits X, wherein X is an integer other than 12.

In example 25, the apparatus of any of examples 21 through 24, the operation comprising: means for mapping the MIB onto OFDM symbols 4, 7, 8, 9, 10, and 11 of the PRBs.

In example 26, the apparatus of any of examples 21 through 25, wherein the MIB carries a bandwidth indicator comprising one bit, a Subframe Number (SFN) indicator comprising eight bits, and a Cyclic Redundancy Check (CRC) field comprising 16 bits.

In example 27, the apparatus of any of examples 21 through 26, the operation comprising: means for encoding the MIB with a one-third rate Tail-Bit Convolutional Code (TBCC).

In example 28, the apparatus of any of examples 21 through 27, the operation comprising: means for rate-matching the MIB an integer number of times N.

In example 29, the apparatus of any of examples 21 through 28, the operation comprising: means for puncturing a number Y of bits from the tail of the MIB.

Example 30 provides machine readable storage media having machine executable instructions that, when executed, cause one or more processors of an Evolved Node B (eNB) operable to communicate with a User Equipment (UE) on a wireless network to perform an operation comprising: generate a Master Information Block (MIB) for transmission on one or more Physical Resource Blocks (PRBs) spanning a plurality of Orthogonal Frequency Division Multiplex (OFDM) symbols, the MIB carrying a subframe index comprising three bits; and map the MIB onto at least one OFDM symbol of the PRBs outside of symbols 7, 8, 9, and 10, wherein transmission of the PRBs is subject to a Listen Before Talk (LBT) procedure.

In example 31, the machine readable storage media of example 30, wherein the subframe index is an subframe offset from the start of a half radio frame.

In example 32, the machine readable storage media of either of examples 30 or 31, wherein the subframe index comprises four bits.

In example 33, the machine readable storage media of any of examples 30 through 32, wherein the MIB comprises 28 bits plus a number of bits X, wherein X is an integer other than 12.

In example 34, the machine readable storage media of any of examples 30 through 33, the operation comprising: map the MIB onto OFDM symbols 4, 7, 8, 9, 10, and 11 of the PRBs.

In example 35, the machine readable storage media of any of examples 30 through 34, wherein the MIB carries a bandwidth indicator comprising one bit, a Subframe Number (SFN) indicator comprising eight bits, and a Cyclic Redundancy Check (CRC) field comprising 16 bits.

In example 36, the machine readable storage media of any of examples 30 through 35, the operation comprising: encode the MIB with a one-third rate Tail-Bit Convolutional Code (TBCC).

In example 37, the machine readable storage media of any of examples 30 through 36, the operation comprising: rate-match the MIB an integer number of times N.

In example 38, the machine readable storage media of any of examples 30 through 37, the operation comprising: puncture a number Y of bits from the tail of the MIB.

Example 39 provides an apparatus of a User Equipment (UE) operable to communicate with an Evolved Node B (eNB) on a wireless network, comprising: a memory to store instructions; and one or more processors to: process a Master Information Block (MIB) received on one or more Physical Resource Blocks (PRBs) spanning a plurality of Orthogonal Frequency Division Multiplex (OFDM) symbols, the MIB carrying a subframe index comprising three bits; and de-map the MIB from at least one OFDM symbol of the PRBs outside of symbols 7, 8, 9, and 10, wherein the PRBs are received over unlicensed spectrum.

In example 40, the apparatus of example 39, wherein the subframe index is an subframe offset from the start of a half radio frame. 41, the apparatus of either of examples 39 or 40, wherein the subframe index comprises four bits.

In example 42, the apparatus of any of examples 39 through 41, wherein the MIB comprises 28 bits plus a number of bits X, wherein X is an integer other than 12.

In example 43, the apparatus of any of examples 39 through 42, wherein the one or more processors are to: de-map the MIB from OFDM symbols 4, 7, 8, 9, 10, and 11 of the PRBs.

In example 44, the apparatus of any of examples 39 through 43, wherein the MIB carries a bandwidth indicator comprising one bit, a Subframe Number (SFN) indicator comprising eight bits, and a Cyclic Redundancy Check (CRC) field comprising 16 bits.

In example 45, the apparatus of any of examples 39 through 44, wherein the one or more processors are to: decode the MIB with a one-third rate Tail-Bit Convolutional Code (TBCC).

In example 46, the apparatus of any of examples 39 through 45, wherein the one or more processors are to: de-rate-match the MIB an integer number of times N.

In example 47, the apparatus of any of examples 39 through 46, wherein the one or more processors are to: zero-pad the tail of the MIB with a number Y of zero bits.

Example 48 provides a User Equipment (UE) device comprising an application processor, a memory, one or more antennas, a wireless interface for allowing the application processor to communicate with another device, and a touch-screen display, the UE device including the apparatus of any of examples 39 through 47.

Example 49 provides a method comprising: processing a Master Information Block (MIB) received on Physical Resource Blocks (PRBs) spanning a plurality of Orthogonal Frequency Division Multiplex (OFDM) symbols, the MIB carrying a subframe index comprising three bits; and de-mapping the MIB from at least one OFDM symbol of the PRBs outside of symbols 7, 8, 9, and 10, wherein the PRBs are received over unlicensed spectrum.

In example 50, the method of example 49, wherein the subframe index is an subframe offset from the start of a half radio frame.

In example 51, the method of either of examples 49 or 50, wherein the subframe index comprises four bits.

In example 52, the method of any of examples 49 through 51, wherein the MIB comprises 28 bits plus a number of bits X, wherein X is an integer other than 12.

In example 53, the method of any of examples 49 through 52, the operation comprising: de-mapping the MIB from OFDM symbols 4, 7, 8, 9, 10, and 11 of the PRBs.

In example 54, the method of any of examples 49 through 53, wherein the MIB carries a bandwidth indicator comprising one bit, a Subframe Number (SFN) indicator comprising eight bits, and a Cyclic Redundancy Check (CRC) field comprising 16 bits.

In example 55, the method of any of examples 49 through 54, the operation comprising: decoding the MIB with a one-third rate Tail-Bit Convolutional Code (TBCC).

In example 56, the method of any of examples 49 through 55, the operation comprising: de-rate-matching the MIB an integer number of times N.

In example 57, the method of any of examples 49 through 56, the operation comprising: zero-padding the tail of the MIB with a number Y of zero bits.

Example 58 provides machine readable storage media having machine executable instructions stored thereon that, when executed, cause one or more processors to perform a method according to any of examples 49 through 57.

Example 59 provides an apparatus of a User Equipment (UE) operable to communicate with an Evolved Node B (eNB) on a wireless network, comprising: means for processing a Master Information Block (MIB) received on Physical Resource Blocks (PRBs) spanning a plurality of Orthogonal Frequency Division Multiplex (OFDM) symbols, the MIB carrying a subframe index comprising three bits; and means for de-mapping the MIB from at least one OFDM symbol of the PRBs outside of symbols 7, 8, 9, and 10, wherein the PRBs are received over unlicensed spectrum.

In example 60, the apparatus of example 59, wherein the subframe index is an subframe offset from the start of a half radio frame.

In example 61, the apparatus of either of examples 59 or 60, wherein the subframe index comprises four bits.

In example 62, the apparatus of any of examples 59 through 61, wherein the MIB comprises 28 bits plus a number of bits X, wherein X is an integer other than 12.

In example 63, the apparatus of any of examples 59 through 62, the operation comprising: means for de-mapping the MIB from OFDM symbols 4, 7, 8, 9, 10, and 11 of the PRBs.

In example 64, the apparatus of any of examples 59 through 63, wherein the MIB carries a bandwidth indicator comprising one bit, a Subframe Number (SFN) indicator comprising eight bits, and a Cyclic Redundancy Check (CRC) field comprising 16 bits.

In example 65, the apparatus of any of examples 59 through 64, the operation comprising: means for decoding the MIB with a one-third rate Tail-Bit Convolutional Code (TBCC).

In example 66, the apparatus of any of examples 59 through 65, the operation comprising: means for de-rate-matching the MIB an integer number of times N.

In example 67, the apparatus of any of examples 59 through 66, the operation comprising: means for zero-padding the tail of the MIB with a number Y of zero bits.

Example 68 provides machine readable storage media having machine executable instructions that, when executed, cause one or more processors of a User Equipment (UE) operable to communicate with an Evolved Node B (eNB) on a wireless network to perform an operation comprising: process a Master Information Block (MIB) received on Physical Resource Blocks (PRBs) spanning a plurality of Orthogonal Frequency Division Multiplex (OFDM) symbols, the MIB carrying a subframe index comprising three bits; and de-map the MIB from at least one OFDM symbol of the PRBs outside of symbols 7, 8, 9, and 10, wherein the PRBs are received over unlicensed spectrum.

In example 69, the machine readable storage media of example 68, wherein the subframe index is an subframe offset from the start of a half radio frame.

In example 70, the machine readable storage media of either of examples 68 or 69, wherein the subframe index comprises four bits.

In example 71, the machine readable storage media of any of examples 68 through 70, wherein the MIB comprises 28 bits plus a number of bits X, wherein X is an integer other than 12.

In example 72, the machine readable storage media of any of examples 68 through 71, the operation comprising: de-map the MIB from OFDM symbols 4, 7, 8, 9, 10, and 11 of the PRBs.

In example 73, the machine readable storage media of any of examples 68 through 72, wherein the MIB carries a bandwidth indicator comprising one bit, a Subframe Number (SFN) indicator comprising eight bits, and a Cyclic Redundancy Check (CRC) field comprising 16 bits.

In example 74, the machine readable storage media of any of examples 68 through 73, the operation comprising: decode the MIB with a one-third rate Tail-Bit Convolutional Code (TBCC).

In example 75, the machine readable storage media of any of examples 68 through 74, the operation comprising: de-rate-match the MIB an integer number of times N.

In example 76, the machine readable storage media of any of examples 68 through 75, the operation comprising: zero-pad the tail of the MIB with a number Y of zero bits.

In example 77, the apparatus of any of examples 1 through 9 and 39 through 47, wherein the one or more processors comprise a baseband processor.

In example 78, the apparatus of any of examples 1 through 9 and 39 through 47, comprising a transceiver circuitry for at least one of: generating transmissions, encoding transmissions, processing transmissions, or decoding transmissions.

In example 79, the apparatus of any of examples 1 through 9 and 39 through 47, comprising a transceiver circuitry for generating transmissions and processing transmissions.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus of an Evolved Node-B (eNB) operable to communicate with a User Equipment (UE) on a wireless network, comprising:
    a memory to store instructions; and
    one or more processors to:
        generate a Master Information Block (MIB) for transmission on one or more Physical Resource Blocks (PRBs) spanning a plurality of Orthogonal Frequency Division Multiplex (OFDM) symbols, the MIB carrying subframe index information and a set of most significant bits of system frame number (SFN) information, wherein a set of least significant bits of the SFN information is indicated via selection of a Cyclic Redundancy Check (CRC) and a scrambling sequence associated with the MIB; and
        map the MIB onto at least one OFDM symbol of the PRBs outside of symbols 7, 8, 9, and 10, wherein transmission of the PRBs is subject to a Listen Before Talk (LBT) procedure.

2. The apparatus of claim 1, wherein the subframe index information comprises a subframe offset from a start of a half radio frame.

3. The apparatus of claim 1, wherein the subframe index information comprises four bits.

4. The apparatus of claim 1, wherein the MIB comprises 28 bits plus a number of bits X, wherein X is an integer other than 12.

5. The apparatus of claim 1, wherein the one or more processors are to:
    map the MIB onto OFDM symbols 4, 7, 8, 9, 10, and 11 of the PRBs.

6. The apparatus of claim 1, further comprising a transceiver circuitry for at least one of:
    generating transmissions, encoding transmissions, processing transmissions, or decoding transmissions.

7. Machine readable storage media having machine executable instructions that, when executed, cause one or more processors of an Evolved Node-B (eNB) operable to communicate with a User Equipment (UE) on a wireless network to perform operations comprising:
    generating a Master Information Block (MIB) for transmission on one or more Physical Resource Blocks (PRBs) spanning a plurality of Orthogonal Frequency Division Multiplex (OFDM) symbols, the MIB carrying subframe index information and a set of most significant bits of system frame number (SFN) information, wherein a set of least significant bits of the SFN information is indicated via selection of a Cyclic Redundancy Check (CRC) and a scrambling sequence associated with the MIB; and mapping the MIB onto at least one OFDM symbol of the PRBs outside of symbols 7, 8, 9, and 10, wherein transmission of the PRBs is subject to a Listen Before Talk (LBT) procedure.

8. The machine readable storage media of claim 7, wherein the subframe index information comprises a subframe offset from a start of a half radio frame.

9. The machine readable storage media of claim 7, wherein the subframe index information comprises four bits.

10. The machine readable storage media of claim 7, wherein the MIB comprises 28 bits plus a number of bits X, wherein X is an integer other than 12.

11. The machine readable storage media of claim 7, the operations further comprising:
mapping the MIB onto OFDM symbols 4, 7, 8, 9, 10, and 11 of the PRBs.

12. The machine readable storage media of claim 7, wherein the MIB carries a bandwidth indicator comprising one bit, the set of most significant bits of SFN information comprising eight bits, and a CRC field comprising 16 bits.

13. An apparatus of a User Equipment (UE) operable to communicate with an Evolved Node-B (eNB) on a wireless network, comprising:
a memory to store instructions; and
one or more processors to:
process a Master Information Block (MIB) received on one or more Physical Resource Blocks (PRBs) spanning a plurality of Orthogonal Frequency Division Multiplex (OFDM) symbols, the MIB carrying subframe index information and a set of most significant bits of system frame number (SFN) information, wherein a set of least significant bits of the SFN information is indicated via selection of a Cyclic Redundancy Check (CRC) and a scrambling sequence associated with the MIB; and
de-map the MIB from at least one OFDM symbol of the PRBs outside of symbols 7, 8, 9, and 10, wherein the PRBs are received over an unlicensed spectrum.

14. The apparatus of claim 13, wherein the subframe index information comprises a subframe offset from a start of a half radio frame.

15. The apparatus of claim 13, wherein the subframe index information comprises four bits.

16. The apparatus of claim 13, wherein the MIB comprises 28 bits plus a number of bits X, wherein X is an integer other than 12.

17. The apparatus of claim 13, wherein the one or more processors are to:
de-map the MIB from OFDM symbols 4, 7, 8, 9, 10, and 11 of the PRBs.

18. The apparatus of claim 13, further comprising a transceiver circuitry for at least one of:
generating transmissions, encoding transmissions, processing transmissions, or decoding transmissions.

19. Machine readable storage media having machine executable instructions that, when executed, cause one or more processors of a User Equipment (UE) operable to communicate with an Evolved Node-B (eNB) on a wireless network to perform operations comprising:
processing a Master Information Block (MIB) received on Physical Resource Blocks (PRBs) spanning a plurality of Orthogonal Frequency Division Multiplex (OFDM) symbols, the MIB carrying subframe index information and a set of most significant bits of system frame number (SFN) information, wherein a set of least significant bits of the SFN information is indicated via selection of a Cyclic Redundancy Check (CRC) and a scrambling sequence associated with the MIB; and
de-mapping the MIB from at least one OFDM symbol of the PRBs outside of symbols 7, 8, 9, and 10, wherein the PRBs are received over an unlicensed spectrum.

20. The machine readable storage media of claim 19, wherein the subframe index information comprises a subframe offset from a start of a half radio frame.

21. The machine readable storage media of claim 19, wherein the subframe index information comprises four bits.

22. The machine readable storage media of claim 19, wherein the MIB comprises 28 bits plus a number of bits X, wherein X is an integer other than 12.

23. The machine readable storage media of claim 19, the operations further comprising: de-mapping the MIB from OFDM symbols 4, 7, 8, 9, 10, and 11 of the PRBs.

24. The machine readable storage media of claim 19, wherein the MIB carries a bandwidth indicator comprising one bit, the set of most significant bits of SFN information comprising eight bits, and a CRC field comprising 16 bits.

* * * * *